(12) United States Patent
Uchibori et al.

(10) Patent No.: US 8,426,747 B2
(45) Date of Patent: Apr. 23, 2013

(54) PRINTED WIRING BOARD

(75) Inventors: Shinya Uchibori, Aichi-ken (JP); Nobumasa Handa, Nishio (JP); Yuuki Sanada, Okazaki (JP)

(73) Assignee: DENSO CORPORATION, Kariya (JP)

( * ) Notice: Subject to any disclaimer, the term of this patent is extended or adjusted under 35 U.S.C. 154(b) by 394 days.

(21) Appl. No.: 12/923,773

(22) Filed: Oct. 7, 2010

(65) Prior Publication Data

US 2011/0094780 A1 Apr. 28, 2011

(30) Foreign Application Priority Data

Oct. 26, 2009 (JP) .................................. 2009-245419

(51) Int. Cl.
*H05K 1/11* (2006.01)
*H05K 3/10* (2006.01)

(52) U.S. Cl.
USPC ............................................ 174/261; 29/846

(58) Field of Classification Search .................. 174/255, 174/261; 361/767–779; 29/846–853
See application file for complete search history.

(56) References Cited

U.S. PATENT DOCUMENTS

| | | | | |
|---|---|---|---|---|
| 5,121,299 | A * | 6/1992 | Frankeny et al. | 361/785 |
| 6,229,098 | B1 * | 5/2001 | Dunn et al. | 174/260 |
| 6,340,798 | B1 | 1/2002 | Tokuda | |
| 2009/0183910 | A1 | 7/2009 | Sunohara | |
| 2010/0200279 | A1 * | 8/2010 | Kariya et al. | 174/255 |
| 2012/0067637 | A1 * | 3/2012 | Chow | 174/261 |

FOREIGN PATENT DOCUMENTS

| | | |
|---|---|---|
| JP | A-S60-113445 | 6/1985 |
| JP | A-07-115342 | 5/1995 |
| JP | A-H08-264941 | 10/1996 |
| JP | A-H09-148748 | 6/1997 |
| JP | A-H09-205269 | 8/1997 |
| JP | A-H11-068267 | 3/1999 |
| JP | A-2001-156408 | 6/2001 |
| JP | A-2001-185663 | 7/2001 |
| JP | A-2002-176262 | 6/2002 |
| JP | A-2002-271020 | 9/2002 |
| JP | A-2003-163452 | 6/2003 |
| JP | A-2003-258427 | 9/2003 |
| JP | A-2003-258428 | 9/2003 |
| JP | A-2004-047796 | 2/2004 |
| JP | A-2006-019321 | 1/2006 |
| JP | A-2006-303202 | 11/2006 |
| JP | A-2007-288102 | 11/2007 |
| JP | A-2009-176791 | 8/2009 |

OTHER PUBLICATIONS

Office Action mailed Sep. 20, 2011 in corresponding JP Application No. 2009-245419 (and English translation).

* cited by examiner

*Primary Examiner* — Jeremy Norris

(74) *Attorney, Agent, or Firm* — Posz Law Group, PLC

(57) ABSTRACT

In a printed wiring board, a first inner layer wiring line is formed on one surface of a wiring line formation layer, a resin film made of electric insulation resin is formed on an area other than the first inner layer wiring line formed on the wiring line formation layer. The resin film and the first inner layer wiring line have the same plane surface. A second wiring line is formed on the resin film, and the second wiring line is thinner in thickness than the first inner layer wiring line. A limit of error in thickness of the resin film and the first inner layer wiring line is within 10% of the thickness of each of the resin film and the first inner layer wiring line.

15 Claims, 12 Drawing Sheets

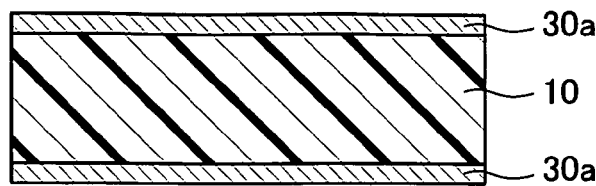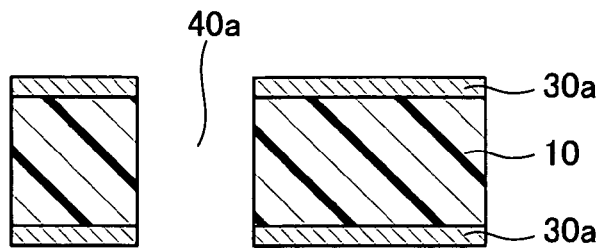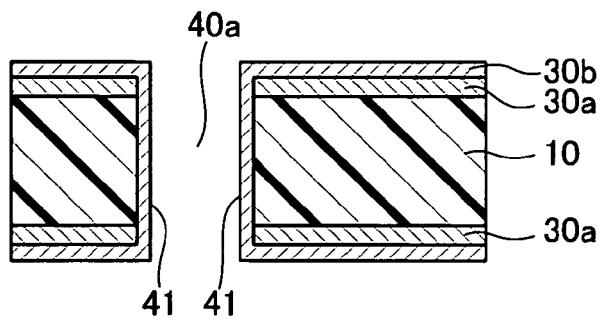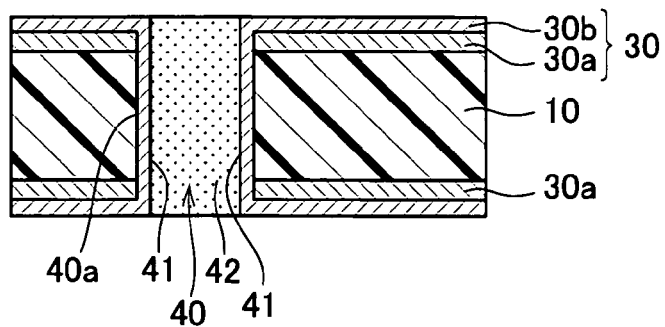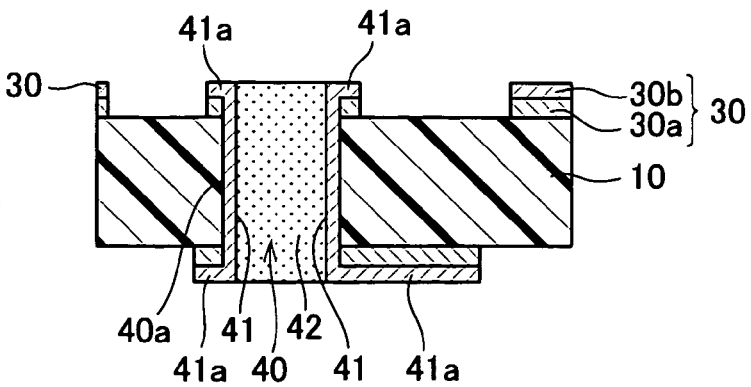

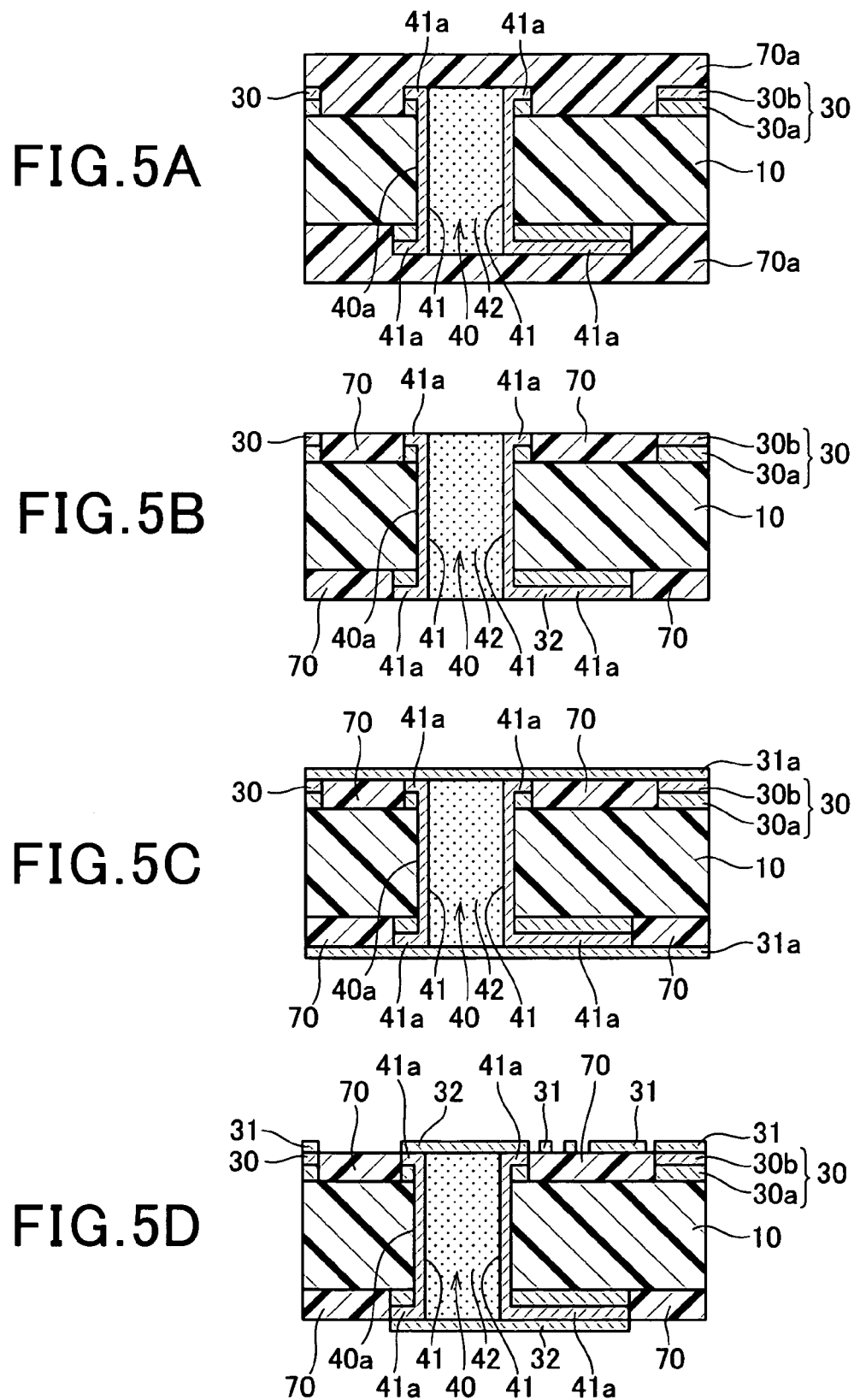

FIG.6
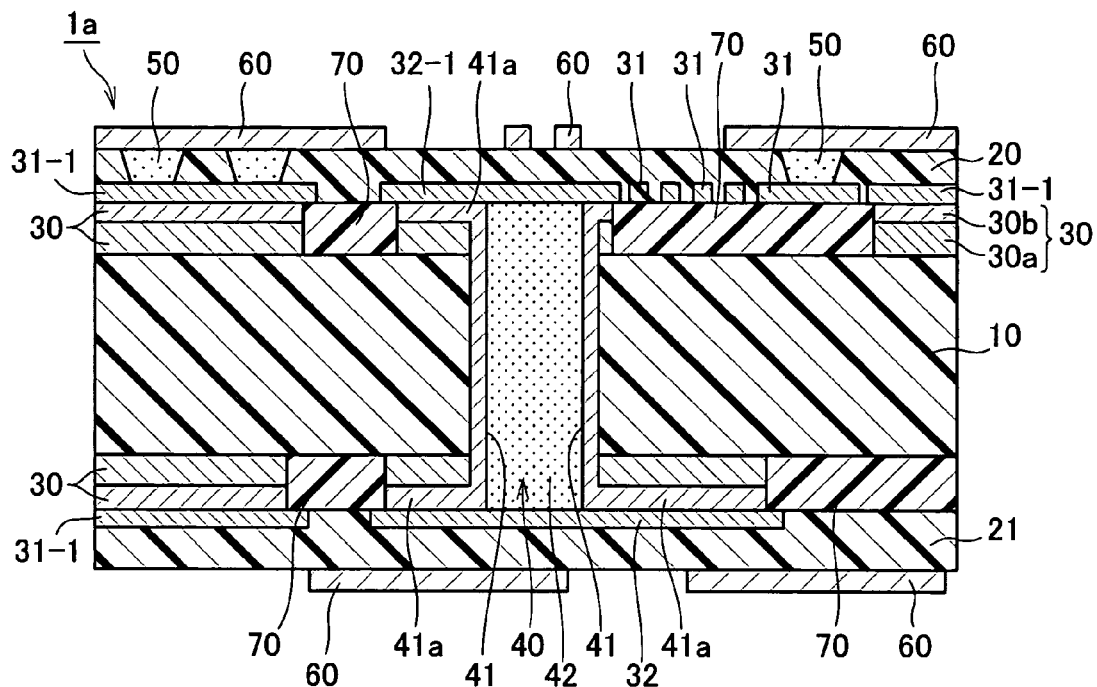
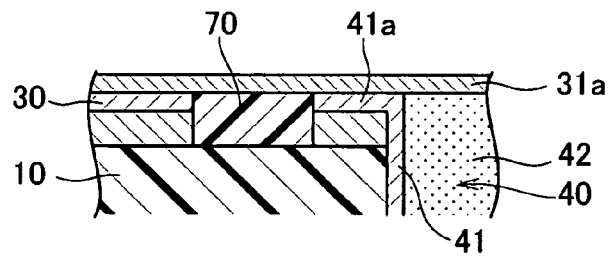
FIG.7A
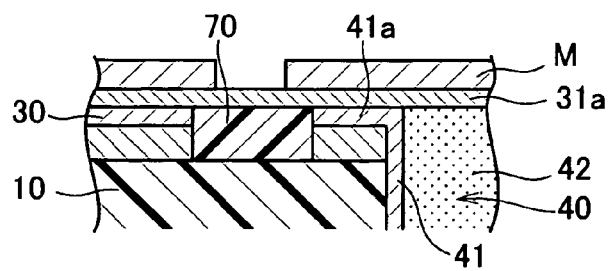
FIG.7B
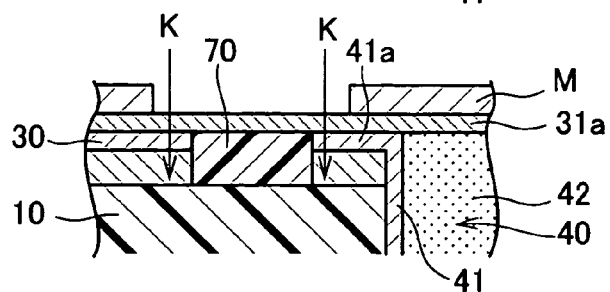
FIG.7C

PRINTED WIRING BOARD

CROSS-REFERENCE TO RELATED APPLICATION

This application is related to and claims priority from Japanese Patent Application No. 2009-245419 filed on Oct. 26, 2009, the contents of which are hereby incorporated by reference.

BACKGROUND OF THE INVENTION

1. Field of the Invention

The present invention relates to a printed wiring board composed of a wiring line formation layer and wiring lines having a different thickness formed on a surface of the wiring line formation layer.

2. Description of the Related Art

In general a printed wiring board is composed a wiring line formation layer and a plurality of wiring lines. These wiring lines have a different thickness and are formed on a surface of the wiring line formation layer.

The wiring lines having a different thickness make it possible to provide a function to flow a large current supplied from a power element flows through a wiring line having a large thickness. Through the wiring line having a large thickness discharges thermal energy. On the other hand, signals transferred from various types of control elements are transferred through a fine wiring line having a small thickness.

For example, a conventional document, Japanese patent laid open publication No. JP 2001-156408 discloses such a printed wiring board in which a first wiring line and a second wiring line having a same thickness are formed on a surface of a wiring line formation layer by performing patterning process to make wiring lines. Then, etching or filling is performed for one which is selected from the first wiring line and the second wiring line in order to increase the thickness of the selected wiring line.

However, in the conventional technique disclosed by the above conventional document, Japanese patent laid open publication No. JP 2001-156408, etching or filling is performed twice for the selected wiring line. That is, the conventional technique requires the step of performing the patterning process at least twice. This would often cause variation in dimension of the wiring line in the patterning formation process.

The inventors according to the present invention study the method to form wiring lines on a surface of a wiring line formation layer in a printed wiring board by using a patterning formation step one time. That is, a first wiring line and a second wiring line having a different thickness are formed by using the patterning formation step only one time.

FIG. 18 shows a schematic cross section of the printed wiring board made by the above method.

As shown in FIG. 18, the printed wiring board is a laminated substrate which is composed of a wiring line formation layer 1810 as an inner core. A first wiring line 1830 having a large thickness is formed on one surface (upper surface or front surface) of the printed wiring board. An insulation layer 1820 is formed on the surface, with which the entire surface of the wiring line formation layer 1810 including the first wiring line 1830 is covered. A second wiring line 1831 having a thickness which is smaller than the thickness of the first wiring line 1830. In the structure of the printed wiring board shown in FIG. 18, the first wiring line 1830 having a large thickness is composed of multi layers.

In the structure of the printed wiring board shown in FIG. 18, the insulation layer 1820 is formed on the first wiring line 1830 having a large thickness, and the second wiring line 1831 having a small thickness is formed on the insulation layer 1820. As shown in FIG. 18, this structure increases the entire thickness of the printed wiring board by the thickness of the insulation layer 1820 because the insulation layer 1820 is formed between the first wiring line 1830 and the second wiring line 1831.

SUMMARY OF THE INVENTION

It is an object of the present invention to provide a printed wiring board with a reduced entire thickness, which is composed of a plurality of wiring lines having a different thickness, and a method of producing the printed wiring board with a reduced entire thickness by performing patterning step to form the wiring lines one time.

To achieve the above purposes, the present invention provides a printed wiring board having a wiring line formation layer, a first wiring line (corresponding to a first inner layer wiring line), a resin film, and a second wiring line (corresponding to a second inner layer wiring line). The wiring lines are formed on at least one surface of the wiring line formation layer. The first wiring line is formed on a surface of the wiring line formation layer. The resin film is formed on an area other than the area. The first wiring line is formed on the surface of the wiring line formation layer so that the first wiring line and the resin film have the same plane surface. That is, the surface of the first wiring line and the surface of the resin film have the same height measured from the surface of the wiring line formation layer. The second wiring line is formed on the surface of the resin film, where the second wiring line is thinner in thickness than the first wiring line.

According to the structure of the printed wiring board described above, the resin film and the first wiring line are formed on the surface of the wiring line formation layer so that the first wiring line and the resin film have the same plane surface. That is, the surface of the first wiring line and the surface of the resin film have the same height measured from the surface of the wiring line formation layer. Further, the second wiring line is formed on the surface of the resin film. This structure of the printed wiring board allows formation of the first wiring line and the second wiring line having a different thickness by performing patterning process at once. The above structure can prevent the entire thickness of the printed wiring board from increasing.

In the printed wiring board as the second aspect of the present invention, the wiring line formation layer further has a through hole and a covering wiring line. The through hole is composed of a penetration hole, a conductive plated layer, a filler member, and a land part. The penetration hole is formed in the wiring line formation layer along a direction in thickness of the wiring line formation layer. The conductive plated layer is formed on an inner wall surface of the through hole. The penetration hole is filled with the filler member. The land part is formed on the surface of the wiring line formation layer by extending the conductive plated layer from the through hole toward the area around the through hole on both of the surfaces, namely, the first and second surfaces of the wiring line formation layer. The area between the land part and the first wiring line is embedded with the resin film. The land part of the through hole is covered with the covering wiring line. The covering wiring line and the second wiring line are made of the same material and have the same thickness.

According to the second aspect of the present invention described above, it is possible to form the covering wiring line and the second wiring line at the same time by performing a single step when the through hole is formed on the wiring line formation layer.

In the printed wiring board as the third aspect of the present invention, the covering wiring line has one of (a) the same shape of the land part observed from a direction which is perpendicular to the direction of the plane surface of the wiring line formation layer, and (b) the shape which is larger than the shape of the land part formed on the wiring line formation layer so that the covering wiring line expands from the outer periphery of the land part.

According to the third aspect of the present invention described above, this structure allows to have a slight difference in position between the covering wiring line and the land part when the covering wiring line is formed on the land part.

In the printed wiring board as the fourth aspect of the present invention, the second wiring line is further formed on the surface of the first wiring line to assemble the first wiring line and the second wiring line together. Further, the second wiring line formed on the first wiring line has one of (a) the same shape of the first wiring line observed from a direction which is perpendicular to the plane surface direction of the wiring line formation layer, and (b) the shape which is larger than the shape of the first wiring line formed on the wiring line formation layer so that the second wiring line expands from the outer periphery of the first wiring line.

According to the fourth aspect of the present invention described above, it is possible to increase the thickness of the first wiring line because the second wiring line is formed on the first wiring line, that is, the first wiring line and the second wiring line are assembled to one body in order to make the thicker first wiring line. This structure of the first wiring line allows to flow a large current and to have an improved thermal discharging capability. It is further possible to have a structure in which the first wiring line and the second wiring line have a slight difference in position.

In the printed wiring board as the fifth aspect of the present invention, the covering wiring line has a shape which is smaller than the outer periphery of the land part observed from a direction which is perpendicularly to the direction of a plane surface of the wiring line formation layer.

In the printed wiring board as the sixth aspect of the present invention, the second wiring line is further formed on the surface of the first wiring line to assemble the first wiring line and the second wiring line together, the second wiring line formed on the first wiring line has a shape which is smaller than the outer periphery of the first wiring line observed from a direction which is perpendicularly to the direction of a plane surface of the wiring line formation layer.

In the printed wiring board as the seventh aspect of the present invention, the conductive layer and the filler member formed in the through hole are made of the same plated material.

According to the seventh aspect of the present invention described above, it is possible to decrease the number of manufacturing steps and manufacturing cost because the conductive layer in the through hole and the filler member can be made with same plating material.

In the printed wiring board as the eighth aspect of the present invention, the resin film and the filler member formed in the through hole are made of the same resin.

According to the eighth aspect of the present invention described above, it is possible to decrease the number of manufacturing steps and manufacturing cost because the resin film and the filler member in the through hole can be made with same resin material.

The printed wiring board as the ninth aspect of the present invention further has an insulation layer with which the first wiring line, the second wiring line, and the covering wiring line are covered, and the insulation layer and the resin film are made of the same resin.

According to the ninth aspect of the present invention described above, because the insulation film and the resin film can be formed with same resin when the wiring line formation layer is covered with the insulation layer, it is possible to decrease the number of manufacturing steps and manufacturing cost. This structure makes it possible for the insulation layer to easily adhere to the resin film.

In the printed wiring board as the tenth aspect of the present invention, the resin film is a rough surface, and the second wiring line is formed on the resin film having a rough surface. This structure makes it possible for the resin film to easily adhere to the second wiring line.

In the printed wiring board as the eleventh aspect of the present invention, the resin film is composed of a first layer and a second layer which are stacked in order on the wiring line formation layer.

This structure makes it possible to change the characteristics of the first layer at the wiring line formation layer side and the second layer at the surface side of the resin film according to necessity.

In the printed wiring board as the twelfth aspect of the present invention, the second wiring line is embedded in the resin film, and the surface of the second wiring line is exposed on the surface of the resin film so that the resin film and the second wiring line have the same plane surface. That is, the surface of the resin film and the surface of the second wiring line have the same height measured from the surface of the wiring line formation layer.

According to the twelfth aspect of the present invention described above, it is possible to prevent the thickness of the printed wiring board from increasing by the thickness of the second wiring line because the second wiring line is exposed so that the second wiring line and the resin film have the same plane surface. That is, the surface of the second wiring line and the surface of the resin film have the same height measured from the surface of the wiring line formation layer. This structure further prevents an uneven surface of the printed wiring board from generating.

In the printed wiring board as the thirteenth aspect of the present invention, a method produces the printed wiring board previously described. In particular, the printed wiring board has an improved structure in which the first wiring line is formed on the wiring line formation layer, the resin film is formed on an area other than the first wiring line on the wiring line formation layer, The resin film and the first wiring line have the same plane surface, the second wiring line is formed on the resin film, the second wiring line is thinner in thickness than the first wiring line. The first resin film and the first wiring line have the same height measured from the surface of the wiring line formation layer. The through hole is formed by making a penetration hole in the wiring line formation layer in its thickness direction. The conductive layer is formed on an inner wall surface of the penetration hole. The penetration hole is filled with a filler member, and the conductive layer is formed expanded from the penetration hole and on the surface of the wiring line formation layer around the penetration hole, the resin film is formed between the land part and the first wiring line. The covering wiring line is formed on the wiring line formation layer, with which the through hole and the land part are covered. The covering wiring line and the second wiring line are made of the same material and the same thickness. In particular, the method according to the thirteenth aspect of the present invention has the following steps.

A first step forms the first conductive layer on the surface of the wiring line formation layer. A second step forms the penetration hole in the wiring line formation layer and the first conductive layer in order to make the through hole.

A third step forms the second conductive layer on the surface of the inner wall surface of the penetration hole and the surface of the first conductive layer by performing plating process, where the second conductive layer formed on the inner wall surface of the penetration hole becomes the conductive layer of the through hole.

A fourth step performs patterning of the first conductive layer and the second conductive layer on the surface of the wiring line formation layer in order to make the first wiring line and the land part of the through hole.

A fifth step fills the inside of the penetration hole as the through hole having the conductive layer with filler member.

A sixth step forms the resin film on the area between the land part and the first conductive layer on the surface of the wiring line formation layer so that the land part and the first conductive layer are embedded with the resin film, the resin film is formed on the area other than the first conductive layer. The surfaces of the resin film and the first conductive layer are flat. That is, they (the resin film and the first conductive layer) have the same height measured from the surface of the wiring line formation layer.

A seventh step forms the third conductive layer on the surface of the resin film and the surface of the land part. Finally, an eighth step performs patterning of the third conductive layer to form the second wiring line and the covering wiring line.

As described above, the present invention provides the method of properly and efficiently producing the printed wiring board.

BRIEF DESCRIPTION OF THE DRAWINGS

A preferred, non-limiting embodiment of the present invention will be described by way of example with reference to the accompanying drawings, in which:

FIG. 4A to FIG. 4E are views showing steps of producing a printed wiring board according to a second embodiment of the present invention;

FIG. 5A to FIG. 5D are views showing steps of producing the printed wiring board according to the second embodiment of the present invention;

FIG. 6 is a view schematically showing a cross section of a printed wiring board according to a third embodiment of the present invention;

FIG. 7A to FIG. 7C are views schematically showing a cross section of the printed wiring board and showing an effect to avoid damage of the printed wiring board caused by etching;

DETAILED DESCRIPTION OF THE PREFERRED EMBODIMENTS

Figure 1:
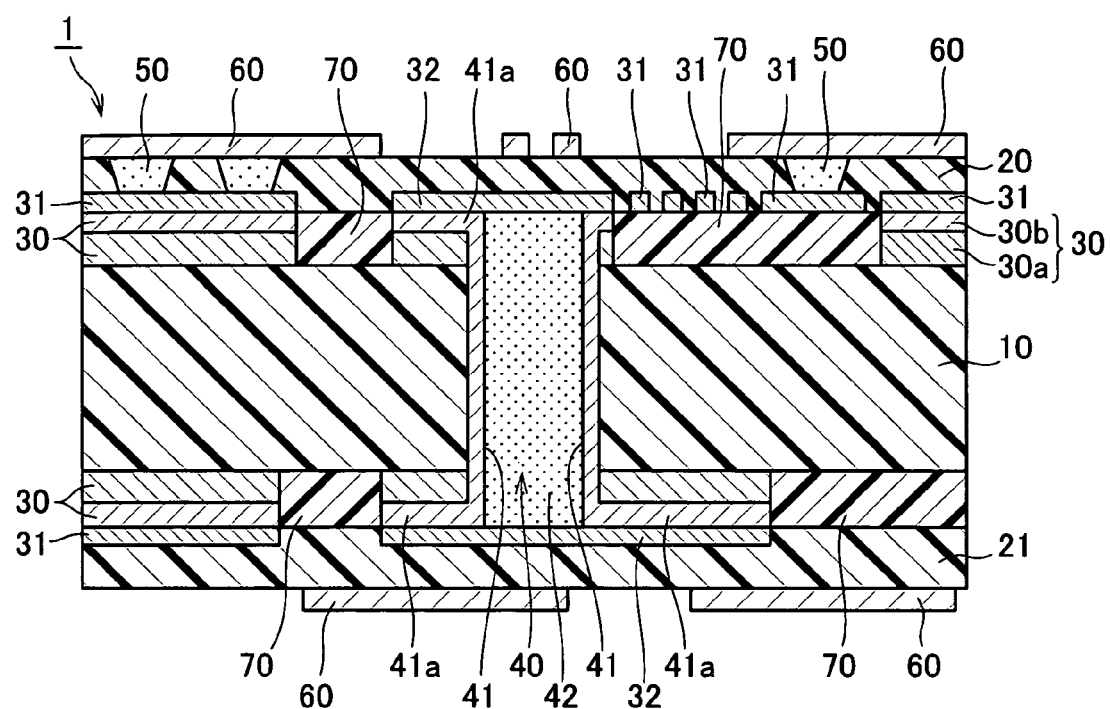
FIG. 1 is a view schematically showing a cross section of a printed wiring board according to a first embodiment of the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of the printed wiring board and the method of producing the printed wiring board according to the first embodiment of the present invention with reference to FIG. 1, FIG. 2A to FIG. 2E, and FIG. 3A to FIG. 3D.

FIG. 1 is a view schematically showing a cross section of the printed wiring board 1 according to the first embodiment of the present invention.

The printed wiring board 1 is used as a circuit board on which power elements capable of driving actuators such as a motor and control circuits capable of controlling those actuators.

The printed wiring board 1 according to the first embodiment has a lamination structure which is composed mainly of a wiring line formation layer 10 as an inner core and insulation layers 20 and 21. In the lamination structure shown in FIG. 1, the insulation layer 20 is formed on one surface (as a front surface or upper surface) of the wiring line formation layer 10, the insulation layer 21 is formed on the other surface (as the bottom side surface) of the wiring line formation layer 10. Inner layer wiring lines 30, 31, and 32, and through holes 40, via holes 50, and front layer wiring lines 60 are electrically connected together. The front layer wiring lines 60 are formed on the surface of each of the insulation layers 20 and 21.

The wiring line formation layer 10 is a plate shaped member having an electrical insulation and serves as the inner core of the printed wiring board 1 as the lamination. Specifically, the wiring line formation layer 10 is made of one or more selected from epoxy resin, polyimide, phenol resin, BT (Bismaleimide Triazine) resin, PPE (Polyphenyleneether) resin, extended porous PPE, acrylic resin, and glass cloth.

The insulation layers 20 and 21 are electrical insulation material, each of which is composed of a first insulation layer 20 and a second insulation layer 21. The first insulation layer 20 is stacked on one surface (upper side surface) of the wiring line formation layer 10, and the second insulation layer 21 is stacked on the other surface (bottom side surface) of the wiring line formation layer 10.

Each of the insulation layers 20 and 21 is made of one or more selected from epoxy resin, polyimide, phenol resin, BT (Bismaleimide Triazine) resin, PPE (Polyphenyleneether) resin, extended porous PPE, acrylic resin, and glass cloth.

The inner layer wiring lines 30, 31, and 32 are formed on one surface and the other surface of the wiring line formation layer 10 between one surface of the wiring line formation layer 10 and the first insulation layer 20, and between the other surface of the wiring line formation layer 10 and the second insulation layer 21.

The inner layer wiring lines 30, 31 and 32 is a single layer or having a lamination structure produced by performing various types of methods such as copper plating, copper foil etching, sputtering, evaporation, and inkjet method. In particular, the lamination structure is composed of multi-layers produced by performing one or more methods described above.

The first inner layer wiring line 30 as the first wiring line in the inner layer wiring lines 30, 31, and 32 is formed on one surface of the wiring line formation layer 10. The first inner layer wiring line 30 has a lamination structure composed of a copper foil 30a, a copper plated layer 30b on the upper surface of the wiring line formation layer 10.

A resin film 70 is formed on the area other than the area where the inner layer wiring line 30 is formed on the surface of the wiring line formation layer 10. The resin film 70 is an electric insulation resin made of one or more selected from epoxy resin, polyimide, phenol resin, BT (Bismaleimide Triazine) resin, PPE (Polyphenyleneether) resin, extended porous PPE, and acrylic resin.

As shown in FIG. 1, the surface of the resin film 70 and the surface of the first inner layer wiring line 30 are formed on the same horizontal line. In other words, the resin film 70 and the first inner layer wiring line 30 have the same plane surface. That is, the thickness of the resin film 70 is substantially equal to the thickness of the first inner layer wiring line 30. In other words, the surface of first inner layer wiring line 30 and the surface of the resin film 70 have the same height measured from the surface of the wiring line formation layer 10.

Because the resin film 70 is formed by applying resin, hardening it, and further grinding it after hardening as necessary, a concave part or convex part is often formed on a central part of the resin film 70. Such a concave part or a convex part formed at a central part of the resin film 70 is remained after completion of forming the resin film 70.

The structure, in which the resin film 70 and the first inner layer wiring line 30 have the same thickness, means that the resin film 70 having such a concave part or a convex part has a thickness which is within an allowable limit of error within 20%, or more preferably, 10% of the thickness of each of the resin film and the first inner layer wiring line. For example, the dimension of thickness of each of the layers 30 and 70 has an error within 20%, in preferably within 10% of the thickness of each of the resin film and the first inner layer wiring line. That is, in the structure of the printed wiring board 1 according to the first embodiment, when the resin film 70 and the inner layer wiring line 30 have an allowable limit of error within the range of 20%, in preferably within the range of 10%, it can be considered that the resin film 70 and the inner layer wiring line 30 are formed on the same surface of the wiring line formation layer 10 even if they have a concave part or a convex part.

The second inner layer wiring line 31 as the second wiring line in the inner layer wiring lines 30, 31, and 32 is formed on the surface of the resin film 70. The second inner layer wiring line 31 is thinner than the first inner layer wiring line 30, and formed by performing copper plating, copper foil etching, sputtering, evaporation, or inkjet method. In the first embodiment, the second inner layer wiring line 31 is made of single layer formed by copper plating. That is, the second inner layer wiring line 31 is formed on the surface of the wiring line formation layer 10 through the resin film 70.

It is possible to form the second inner layer wiring line 31 only on the surface of the resin film 70. However, as shown in FIG. 1, it is possible to further form the second inner layer wiring line 31 on the surface of the first inner layer wiring line 30 in addition to on the surface of the resin film 70.

In this case, the second inner layer wiring line 31 is electrically connected to the first inner layer wiring line 30, and these wiring lines 30 and 31 are assembled together to make one single wiring line. This structure makes it possible to increase the thickness of the first inner layer wiring line 30 and to use the first inner layer wiring line 30 as a large current wiring line capable of flowing a large current and also efficiently discharging thermal energy.

The through hole 40 is formed in the wiring line formation layer 10 of the printed wiring board 1 according to the first embodiment of the present invention. The wiring line 32 serves as a cover wiring 2. That is, the wiring line 32 is formed on each of the surface of the through hole 40 so that the through hole 40 is covered or sealed with the wiring line 32.

The through hole 40 is formed by making a penetration hole in the wiring line formation layer 10 in its thickness direction, and making an electric conductor 41 on the inner wall of the penetration hole, and filling the penetration hole with a filler member 42.

The electric conductor 41 is made of a copper plated layer, as well as the case of the copper plated layer 30b formed on the copper foil 30a in the first inner layer wiring line 30. That is, the electric conductor 41 and the copper plated layer 30b are made of the same copper plated layer.

The filler member 42 is made of one or more selected from epoxy resin containing copper grains, epoxy resin containing copper grains coated with silver, phenol resin containing copper grains coated with silver, polyimide and an electric conductive paste.

As shown in FIG. 1, each of the end parts of the through hole 40 serves as a land part 41a which is made of the electric conductor 41 and projects from the one surface of the opening of the through hole 40, and extends toward the edge part of the opening of the through hole 40 and is extended toward the peripheral part of the opening of the through hole 40. A part between the land part 41a and the first inner layer wiring line 30 is filled with the resin film 70.

Because the inner layer wiring line 32 covers the land part 41a on the wiring line formation layer 10, it will be called to as the "covering wiring line 32". The covering wiring line 32 is directly and electrically connected to the land part 41a. As shown in FIG. 1, the filler member 42 placed at the central area (or at the inside area) of the land part 41a is also covered with the covering wiring line 32.

The covering wiring line 32 has the same thickness of the second inner layer wiring line 31 and is made of the same material of the second inner layer wiring line 31. The covering wiring line 32 is formed by a known method such as copper plating, copper foil etching, sputtering, evaporation, and inkjet method. In the first embodiment, the covering wiring line 32 has a copper plated single layer.

In the first embodiment, the covering wiring line 32 is not formed on the surface of the resin film 70 on the other surface of the wiring line formation layer 10. As shown in FIG. 1, the first inner layer wiring line 30, the resin film 70, the second inner layer wiring line 31 formed on the first inner layer wiring line 30, and the covering wiring line 32 are formed on the other surface of the wiring line formation layer 10, as well as those formed on one surface of the wiring line formation layer 10.

The inner layer wiring lines 30, 31, and 32 formed on one surface of the wiring line formation layer 10 are electrically connected to those formed on the other surface of the wiring line formation layer 10 through the through hole 40.

In the first embodiment, various types of electric components such as power elements (not shown) and control elements (not shown) are mounted on the printed wiring board 1 according to the first embodiment. For example, those elements are mounted on the electric conductor 60 (as the front layer wiring lines 60) formed on the first insulation layer 20.

On the other hand, a cooling member (not shown) is stacked on the second insulation layer 21 formed on the other surface of the wiring line formation layer 10. Thermal energy generated in the printed wiring board 1 can be discharged through the cooling member to the outside of the printed wiring board 1.

The front layer wiring line 60 plated with copper is formed on the surfaces of the first and second insulation layers 20 and 21. The front layer wiring lines 60 formed on the first insulation layer 20 side is electrically connected to the inner layer electric conductors such as the first inner layer wiring line 30, the second inner layer wiring line 31, and the covering wiring line 32 through the via holes 50. Each of the via holes 50 is made by forming a hole by a laser apparatus or a press machine with a die, and then filling the hole with conductive material by performing copper plating.

In the first embodiment shown in FIG. 1, a power element (not shown) which generates large quantity of thermal energy is electrically connected to the first inner layer wiring line 30 having a large thickness, when compared with the thickness of the second inner layer wiring line 31, through the via hole 50 and the front layer wiring lines 60 formed in and on the first insulation layer 20.

On the other hand, a receiving element (not shown) which generates small quantity of thermal energy is electrically connected to the second inner layer wiring line 31 having a mall thickness, when compared with the thickness of the first inner layer wiring line 30, through the via hole 50 and the front layer wiring lines 60 formed in and on the first insulation layer 20.

Next, a description will now be given of the method of producing the printed wiring board 1 according to the first embodiment with reference to FIG. 2A to FIG. 2E, and FIG. 3A to FIG. 3D.

FIG. 2A to FIG. 2E are views showing steps of producing the printed wiring board 1 according to the first embodiment of the present invention. FIG. 3A to FIG. 3D are views showing steps of producing the printed wiring board 1 according to the first embodiment of the present invention.

Each of FIG. 2A to FIG. 2E and FIG. 2A to FIG. 2E shows a cross section of the printed wiring board 1 in each of the steps of producing the printed wiring board 1 according to the first embodiment.

Figure 2A:
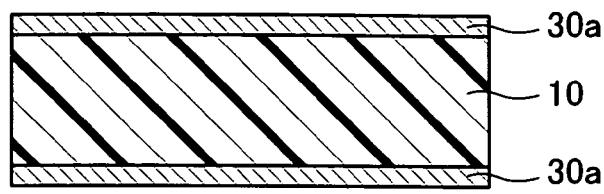
FIG. 2A to FIG. 2E are views showing steps of producing the printed wiring board according to the first embodiment of the present invention.

In the first step shown in FIG. 2A, a copper foil 30a is formed on the entire of the first surface (or the front surface) of the wiring line formation layer 10 by a suitable method such as thermo compression bonding. The copper foil 30a serves as the first conductive layer. It is also possible to form the first conductive layer by plating, evaporation, sputtering, etc.

Figure 2B:
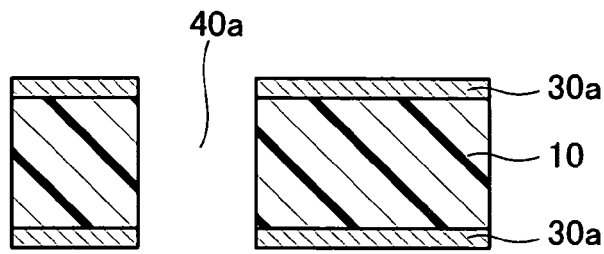

Next, in the second step shown in FIG. 2B, a hole 40a is formed in the wiring line formation layer 10 and the first conductive layer 30a by punching or drilling.

Figure 2C:
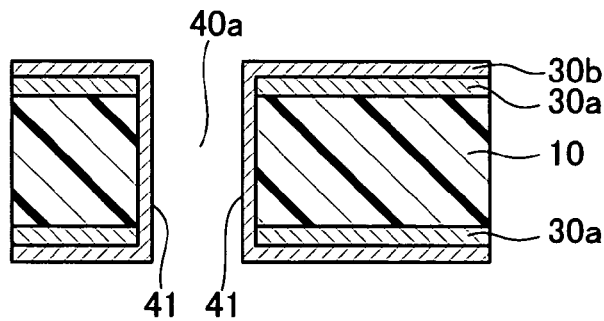

Next, in the third step shown in FIG. 2C, a copper plated layer 30b is formed in the inner wall surface of the hole 40a and on the surface of the copper foil 30a as the first conductive layer. The copper plated layer 30b serves as the second conductive layer.

The copper plated layer 30b is formed in the surface of the inner wall of the hole 40a and on the surface of the copper foil 30a on both the surfaces of the wiring line formation layer 10. The copper plated layer 30b formed on the surface of the inner wall of the hole 40a becomes a conductive part of the through hole 40.

Figure 2D:
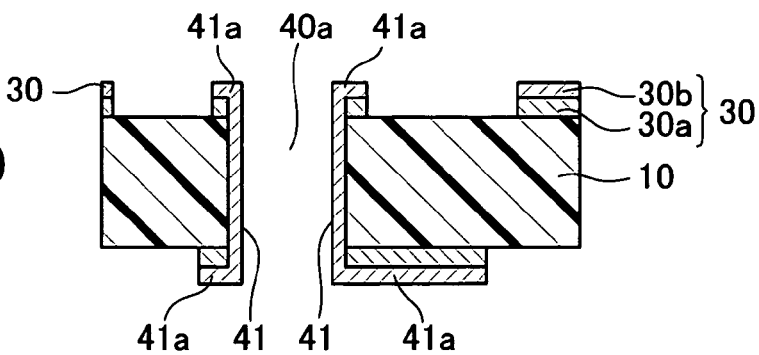

Next, the fourth step shown in FIG. 2D performs patterning the copper foil 30a as the first conductive layer and the copper plated layer 30b as the second conductive layer formed on the surface of the wiring line formation layer 10 in order to form the first inner layer wiring line 30 and the land part 41a of the through hole 40. The fourth step further performs patterning on the other surface of the wiring line formation layer 10. The patterning is a known photolithograph method.

Figure 2E:
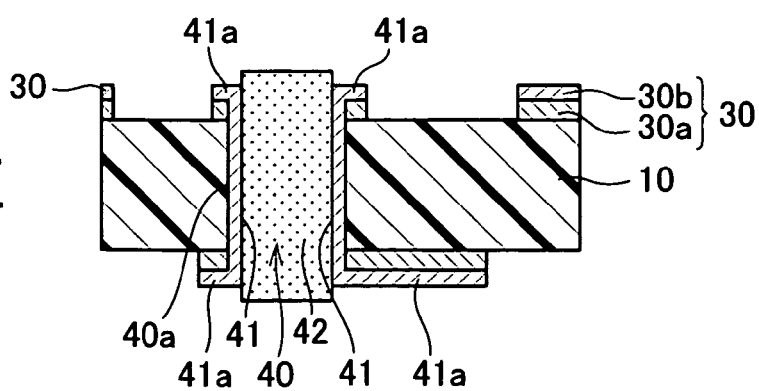

In the fifth step shown in FIG. 2E, the hole 40a as the through hole 40 in which the electric conductor 41 is formed is filled with the filler member 42 by a printing or dispensing method.

Figure 3A:
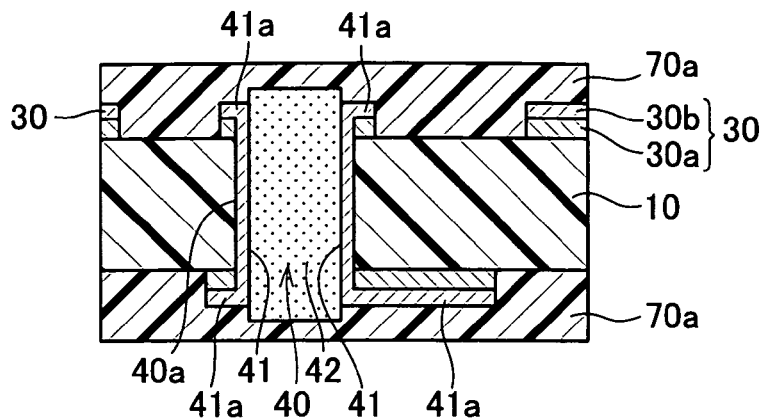
FIG. 3A to FIG. 3D are views showing steps of producing the printed wiring board according to the first embodiment of the present invention.
Figure 3B:
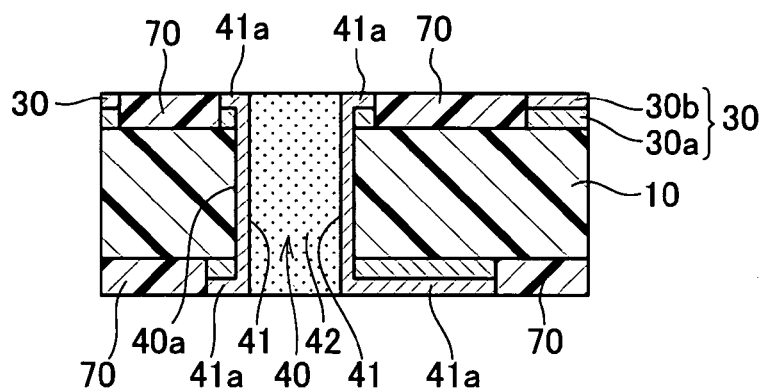

Next, in the sixth step shown in FIG. 3A and FIG. 3B, the part between the land part 41a and the first inner layer wiring line 30 on the surface of the wiring line formation layer 10 are filled with the resin film 70. The resin film 70 is formed at the parts other than the first inner layer wiring line 30 on the surface of the wiring line formation layer 10 so that the resin film 70 and the first inner layer wiring line 30 has the same plane surface. That is, the surface of the resin film 70 and the surface of the first inner layer wiring line 30 have the same height measured from the surface of the wiring line formation layer 10.

Specifically, as shown in FIG. 3A, the entire surface including the land part 41a and the first inner layer wiring line 30 on each of the surfaces of the wiring line formation layer 10 is covered with a resin film material 70a.

The resin film material 70a is applied on the above entire surface by using a mask pattern printing method, roll coating method, or screen coating method, and then hardened to produce the resin film 70 by heating or UV radiation.

The resin film material 70a is then grinded until the land part 41a and the first inner layer wiring line 30 are exposed in order to obtain the resin film material 70a and the first inner layer wiring line 30 having the same thickness. The sixth step described above makes the resin film 70 and the first inner layer wiring line 30 which have the same plane surface, namely, the same thickness. In addition, the above sixth step also makes the filler member 42 so that the filler member 42, the resin film 70, and the first inner layer wiring line 30 have the same plane by physical polishing method such as buffing or belt polishing.

Figure 3C:
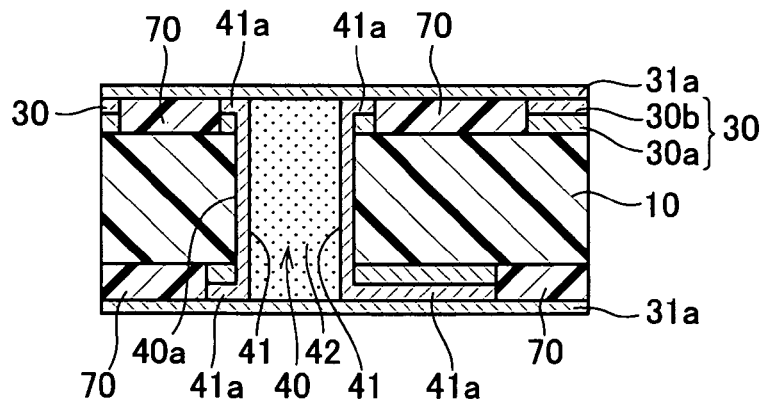

Next, in the seventh step shown in FIG. 3C, the copper plated wiring line as the third conductive layer 31a is formed on the surface of the resin film 70 and the land part 41a. It is possible to form the third conductive layer 31a by using a copper foil, performing sputtering, evaporation, inkjet method, etc., instead of the copper plating.

Figure 3D:
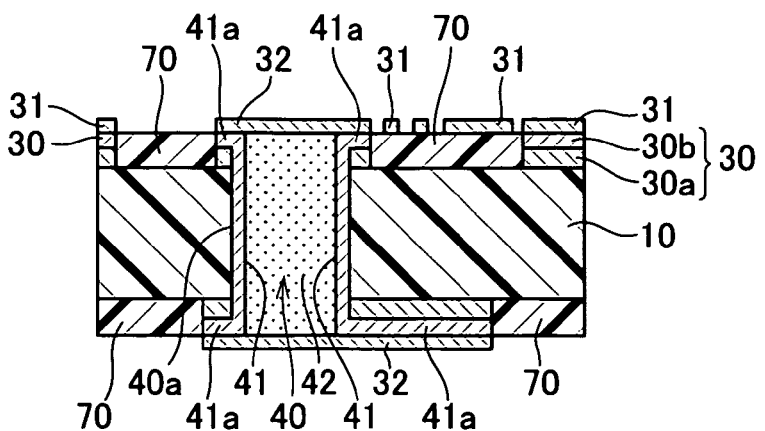

In the eighth step shown in FIG. 3D, the second inner layer wiring line 31 and the covering wiring line 32 are formed by patterning the copper plated wiring line 31a as the third conductive layer. The other surface of the wiring line formation layer 10 is processed by the same patterning. This patterning is a known lithography method.

As omitted from FIG. 2A to FIG. 2E and FIG. 3A to FIG. 3D, the insulation layers 20 and 21 are bonded and fixed onto both the surfaces of the wiring line formation layer 10 by thermo compression bonding. The holes are formed in the first insulation layer 20 by using a laser beam. Those holes become the via holes 50.

Next, copper plated parts are formed by performing electroless plating or electro plating or by performing printing conductive paste in order to fill the via holes 50 with the copper plated parts. This makes it possible to form the via holes 50 and the conductive layer which becomes a surface layer wiring line 60. The formation of the printed wiring board 1 according to the first embodiment is thereby completed.

In the structure of the printed wiring board 1 according to the first embodiment, the resin layer 70 is formed on the front surface of the wiring line formation layer 10, in which the resin layer 70 and the first inner layer wiring lie 30 have the same plane surface, and the second inner layer wiring line 31 is formed on the surface of the resin layer 70. That is, the surface of the resin film 70 and the surface of the first inner layer wiring line 30 have the same height measured from the surface of the wiring line formation layer 10. This structure of the printed wiring board 1 makes it possible to efficiently prevent the thickness of the printed wiring board 1 from increasing.

Figure 18:
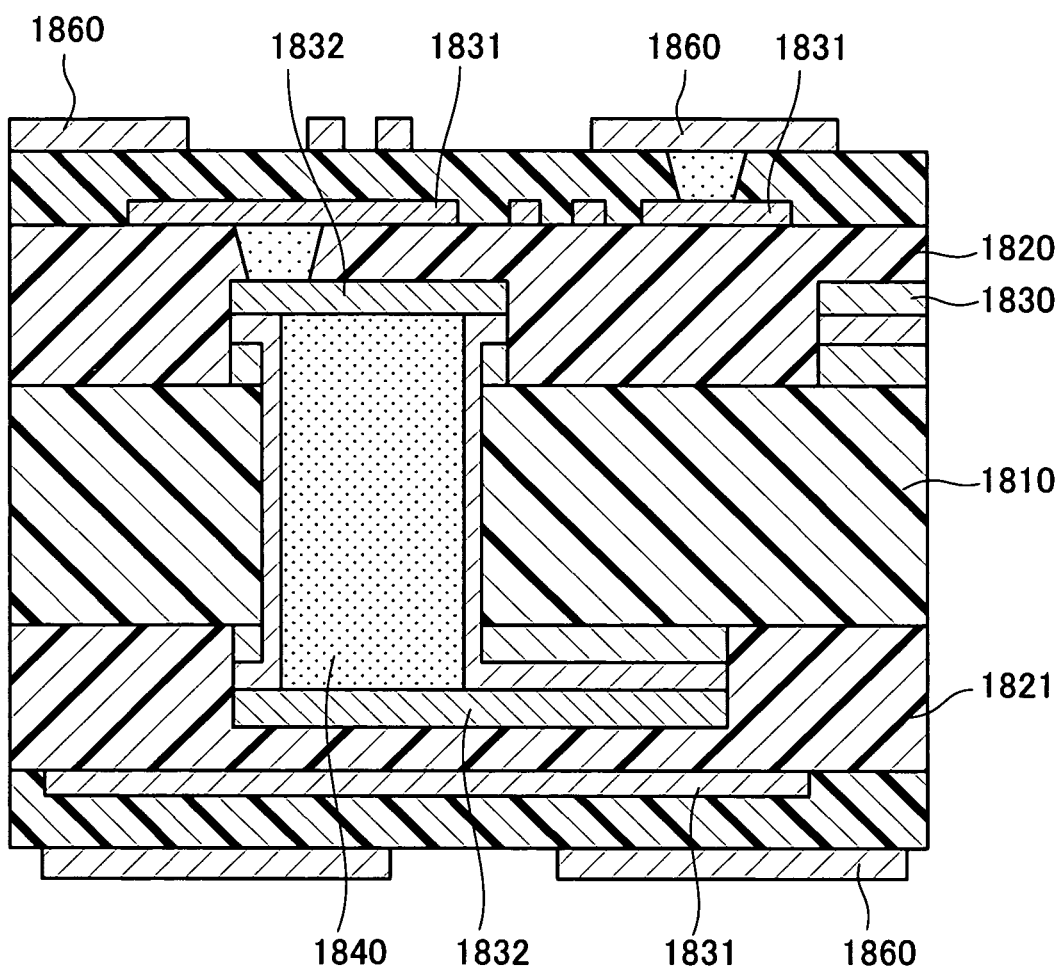
FIG. 18 is a view schematically showing a cross section of a printed wiring board.

On the other hand, in the structure of the printed wiring board shown in FIG. 18, the insulation layer 1820 is formed on the surface of the wiring line formation layer 1810, and the first inner layer wiring line 1830 is separated in the thickness direction of the printed wiring board from the second inner layer wiring line 1831 by the thickness of the insulation layer 1820. That is, the entire thickness of the printed wiring board is increased by the thickness of the insulation layer 1820 when compared with the structure of the printed wiring board 1 according to the first embodiment. Thus, it is possible for the structure of the first embodiment to decrease the entire thickness of the printed wiring board 1 shown in FIG. 1 by the thickness of the insulation layer 1820 when compared with the entire thickness of the printed wiring board shown in FIG. 18.

Still further, according to the first embodiment, the fourth step forms the first inner layer wiring line 30 and the eighth step forms the second inner layer wiring line 31. That is, the first inner layer wiring line 30 and the second inner layer wiring line 31 having a different thickness are formed by a single patterning. This makes it possible to suppress the thickness of the printed wiring board 1 from increasing as low as possible.

Still further, according to the first embodiment, the covering wiring line 32 formed on the through hole 40 and the second inner layer wiring line 31 are made of the same material and have the same thickness. This makes it possible to form the first inner layer wiring line 30 and the second inner layer wiring line 31 by the same step one time. This can decrease the number of steps which are necessary to produce the printed wiring board 1.

Still further, according to the first embodiment, it is possible to make the electric conductor 41 and the filling member 42 by the same plated material. This case allows formation of the filler member 42 after forming the electric conductor 41 by the same copper plating. Because the electric conductor 41 and the filler member 42 are formed by the same plating material, it is possible to decrease the total number of steps to produce the printed wiring board 1 and the manufacturing cost of the printed wiring board 1.

In the first embodiment, it is possible to make the resin film 70 and the filler member 42 with the same resin. This makes it possible to decrease the manufacturing cost of the printed wiring board 1 because of using the same resin material.

Still further, in the structure of the printed wiring board 1 according to the first embodiment, the first insulation layer 20, with which the inner layer wiring lines 30, 31, and 32 and the resin film 70 are covered, is formed on the surface of the wiring line formation layer 10. It is possible to form the first insulation layer 20 and the resin film 70 with the same resin material.

Because it is possible to form the first insulation layer 20 and the resin film 70 with the same resin material, this makes it possible to decrease the manufacturing cost to produce the printed wiring board 1, and to easily make the strong adhesion between the first insulation layer 20 and the resin film 70. The same effect can be obtained when the wiring line formation layer 10 and the second insulation layer 21 are made by the same resin material. Still further, it is possible to form the resin film 70, the insulation layers 20 and 21, and the filler member 42 with the same resin material.

Still further, in the first embodiment, it is possible to roughly form the surface of the resin film 70, and to form the second inner layer wiring line 31 on the rough surface of the resin film 70. In order to obtain the roughed surface of the resin film 70, there are various methods such as chemical etching using acid or alkali, or physical etching or grinding it with blast processing. This makes it possible to easily make the strong adhesion between the resin film 70 and the second inner layer wiring line 31, and thereby possible to avoid the second inner layer wiring line 31 from being separated from the resin film 70.

Second Embodiment

A description will be given of the printed wiring board and the method of producing the printed wiring board according to the second embodiment of the present invention with reference to FIG. 4A to FIG. 4E, and FIG. 5A to FIG. 5D.

FIG. 4A to FIG. 4E are views showing steps of producing a printed wiring board according to the second embodiment of the present invention. FIG. 5A to FIG. 5D are views showing steps of producing the printed wiring board according to the second embodiment of the present invention. Thus, FIG. 4A to FIG. 4E and FIG. 5A to FIG. 5E show a cross section in each of the steps to produce the printed wiring board according to the second embodiment.

In the method of producing the printed wiring board according to the second embodiment, as shown in FIG. 4A, FIG. 4B, and FIG. 4C, as well as the method of the first embodiment previously described, the first step, the second step, and the third step are performed in order. That is, the first step bonds the copper foil 30a as the first conductive layer to the wiring line formation layer 10. The second step forms the hole 40a as the through hole 40. The third step forms the copper plated layer 30b as the second conductive layer.

Next, in the second embodiment, as shown in FIG. 4D, the fifth step fills the hole 40a as the through hole 40 in which the electric conductor 41 is formed with the filler member 42.

After completion of the fifth step, the second embodiment performs the fourth step shown in FIG. 4E. The fourth step performs patterning of the first conductive layer 30a and the second conductive layer 30b formed on both the surface of the wiring line formation layer 10 in order to form the first inner layer wiring line 30 and the land part 41a of the through hole 40.

As shown in FIG. 4E, both ends of the filler member 42 are grinded after completion of filling the filler member 42 so that both the ends of the filler member 42 project from the land part 41a at both the surfaces of the wiring line formation layer 10. It is not necessary to perform this grinding process when both the ends of the filler member 42 project from the surfaces of the wiring line formation layer 10.

After this, as well as the steps of the first embodiment previously described, the second embodiment performs the sixth step, the seventh step, and the eighth step. That is, the sixth step forms the resin film 70. The seventh step forms the copper plated layer 31a as the third conductive layer. The eighth step performs patterning in order to form the second inner layer wiring line 31 and the covering wiring line 32.

After completion of the eighth step, the method according to the second embodiment forms the via holes 50 and the front layer wiring lines 60, as well as the method of the first embodiment, in order to produce the printed wiring board 1 shown in FIG. 1.

Third Embodiment

A description will be given of the printed wiring board 1a and the method of producing the printed wiring board 1a according to the third embodiment of the present invention with reference to FIG. 6, and FIG. 7A to FIG. 7C.

FIG. 6 is a view schematically showing a cross section of the printed wiring board 1a according to the third embodiment of the present invention.

The printed wiring board 1a according to the third embodiment shown in FIG. 6, the covering wiring line 32-1 is formed so that the length of the land part 32-1 is larger in the plane direction of the wiring line formation layer 10 than that of the land part 41a of the through hole 40. That is, the covering wiring line 32-1 protrudes out of the outer periphery of the land part 41a of the through hole 40.

Even if an alignment error occurs between the covering wiring line 32-1 and the land part 41a when the covering wiring line 32-1 is formed on the land part 41a, the structure of the covering wiring line 32-1 in the third embodiment is adequately free from the influence of this misalignment, and the covering wiring line 32-1 can be electrically connected to the land part 41a of the through hole 40.

Because the land part 41a has a wide dimension, the covering wiring line 32-1 can be electrically connected to the land part 41a of the through hole 40 even if the covering wiring line 32-1 and the land part has the same plane surface in size. That is, the third embodiment has the structure in which the external shape of the covering wiring line 32-1 is equal or larger than that of the land part 41a. As shown in FIG. 6, the protruded part of the covering wiring line 32-1 protruded from the external shape of the land part 41a is contacted to the surface of the resin film 70.

Still further, in structure of the printed wiring board 1a according to the third embodiment shown in FIG. 6, the second inner layer wiring line 31-1 is formed on the surface of the first inner layer wiring line 30. The first and second inner layer wiring lines 30 and 31-1 are laminated to serve as a single wiring line.

In the lamination structure of the wiring lines 30 and 31-1 in the printed wiring board 1a according to the third embodiment, the second inner layer wiring line 31-1 has the same shape of the plane surface of the first inner layer wiring line 30, or protrudes out of the first inner layer wiring line 30. That is, the second inner layer wiring line 31-1 is formed so that the dimension (external form in length and wide) of the second inner layer wiring line 31-1 is larger in the plane direction of the wiring line formation layer 10 than that of the first inner layer wiring line 30. That is, the second inner layer wiring line 31-1 protrudes out of the outer periphery of the first inner layer wiring line 30.

According to the structure of the printed wiring board according to the third embodiment, even if an alignment error occurs between the second inner layer wiring line 31-1 and the first inner layer wiring line 30 when the second inner layer wiring line 31-1 is formed on the first inner layer wiring line 30, the structure of the second inner layer wiring line 31-1 is adequately free from the influence of this misalignment.

As shown in FIG. 6, the protruded part of the second inner layer wiring line 31-1 protruded from the external shape of the first inner layer wiring line 30 is contacted to the surface of the resin film 70.

Further, the covering wiring line 32-1 and the second inner layer wiring line 31-1 are formed by lithography method, as well as the first embodiment. In this case, it is possible to avoid occurrence of damage caused in the first inner layer wiring line 30 and the land part 41a by etching because the covering wiring line 32-1 and the second inner layer wiring line 31-1 can be formed so that they protrude out from the first inner layer wiring line 30 and the land part 41a.

FIG. 7A to FIG. 7C are views schematically showing a cross section of the printed wiring board 1a and showing an effect to avoid damage of the printed wiring board 1a caused by etching.

As shown in the structure of the first and second embodiment, the copper plated layer 31a as the third conductive layer is formed on the surface of the resin film 70 and the land part 41a (see FIG. 7A), and etched by using a patterning mask M in order to form the covering wiring line 32-1 and the second inner layer wiring line 31-1 (see FIG. 7B).

At this time, as shown in FIG. 7B, the patterning mask M protrudes from the outer periphery of the first inner layer wiring line 30 and the land part 41a so that the covering wiring line 32-1 and the second inner layer wiring line 31-1 protrude from the outer periphery of the first inner layer wiring line 30 and the land part 41a. This makes it possible to avoid any influence of performing etching when the second inner layer wiring line 31-1 and the covering wiring line 32-1 are formed because the entire of the first inner layer wiring line 30 and the land part 41a are covered with the patterning mask M.

At this time, when patterning is performed so that the covering wiring line 32-1 and the second inner layer wiring line 31-1 are shorter in outer size than the outer periphery of the first inner layer wiring line 30 and the land part 41a, as shown in FIG. 7C, the end part of the patterning mask M becomes smaller than the outer periphery of the first inner layer wiring line 30 and the land part 41a. This structure exposes the end part of the first inner layer wiring line 30 and the land part 41a to acid used by etching when the second inner layer wiring line 31-1 and the covering wiring line 32-1 are formed.

For example, the parts designated by the arrow mark K shown in FIG. 7C in the first inner layer wiring line 30 and the land part 41a are damaged by etching. On the other hand, the structure of the printed circuit board 1a shown in FIG. 8 can avoid occurrence of such damage during etching.

It is acceptable to form the second inner layer wiring line 31-1 on the surface of the resin film 70, not on the first inner layer wiring line 30.

Fourth Embodiment

A description will be given of the printed wiring board 1a and the method of producing the printed wiring board 1b according to the fourth embodiment of the present invention with reference to FIG. 8 and FIG. 9.

Figure 8:
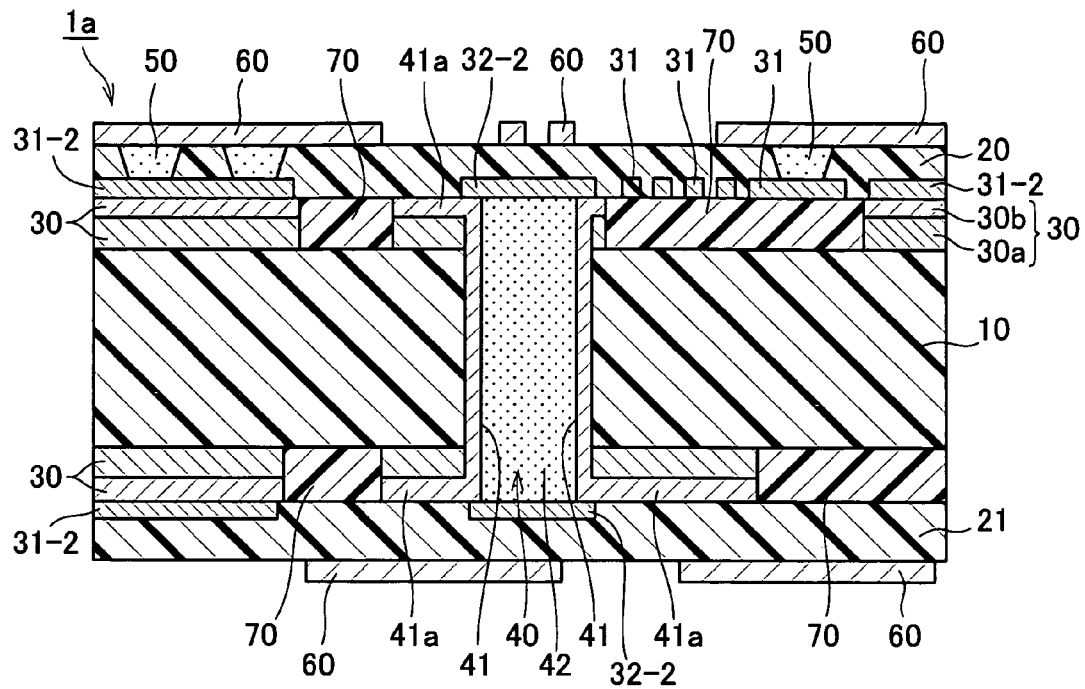
FIG. 8 is a view schematically showing a cross section of a printed wiring board according to a fourth embodiment of the present invention.

FIG. 8 is a view schematically showing a cross section of the printed wiring board 1b according to the fourth embodiment of the present invention.

The structure of the printed wiring board 1b according to the fourth embodiment has a covering wiring line 32-2 having a different structure when compared with the covering wiring line 32 in the printed wiring board 1 according to the first embodiment. Other components of the printed wiring board 1b according to the fourth embodiment are the same of those in the printed wiring board 1 according to the first embodiment. Accordingly, the following description will mainly explain the covering wiring line 32-2 having a different structure.

As shown in FIG. 8, the shape of the covering wiring line 32-2 is smaller than the shape, namely, the outer periphery of the land part 41a. In the structure of the printed wiring board 1b according to the fourth embodiment, the entire shape of the covering wiring line 32-2 is smaller than that of the land part 41a in the direction of the plane surface of the wiring line formation layer 10.

Further, as shown in FIG. 8, the second inner layer wiring line 31-2 is formed on the surface of the first inner layer wiring line 30. The first and second inner layer wiring lines 30 and 31-2 are laminated and serve as a single wiring line. In particular, the second inner layer wiring line 31-2 is smaller in the plane direction of the surface of the wiring line formation layer 10 than the outer shape of the first inner layer wiring line 30. That is, the second inner layer wiring line 31-2 is smaller in the plane size than the outer periphery of the first inner layer wiring line 30.

The covering wiring line 32-2 and the second inner layer wiring line 31-2 are formed by an additive method, which are different from the steps of the first embodiment as shown in FIG. 2A to FIG. 2E and FIG. 3A to FIG. 3D.

The additive method is a known method. FIG. 9 is a view schematically showing a step of forming a pattern of cover wiring lines and inner layer wiring lines in the printed wiring board 1b according to the fourth embodiment of the present invention.

Figure 9:
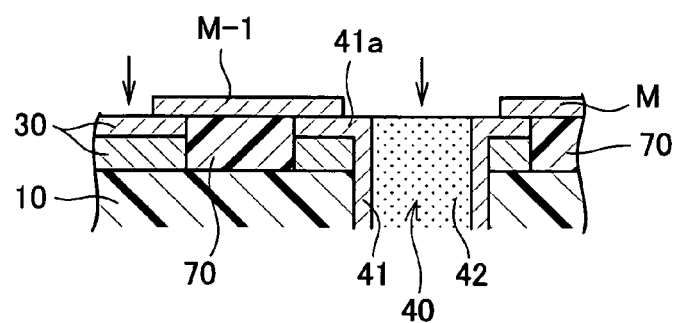
FIG. 9 is a view schematically showing a step of forming a pattern of cover wiring lines and inner layer wiring lines in the printed wiring board according to the fourth embodiment of the present invention.

As shown in FIG. 9, the fourth embodiment uses a patterning mask M-1 to form an opening in a part at which the second inner layer wiring line 31-2 and the covering wiring line 32-2 are formed on the surface of the resin film 70 and the land part 41a. The patterning mask M-1 covers the part other than the part to form the opening. The copper plating is performed by using the patterning mask M-1 to form the covering wiring line 32-2 and the second inner layer wiring line 31-2. After completion of the copper plating, the patterning mask M-1 is removed.

As well as the third embodiment shown in FIG. 6, it is acceptable to form the second inner layer wiring line 31-2 on the surface of the resin film 70, not on the first inner layer wiring line 30.

Fifth Embodiment

A description will be given of the printed wiring board 1a and the method of producing the printed wiring board 1c according to the fifth embodiment of the present invention with reference to FIG. 10.

Figure 10:
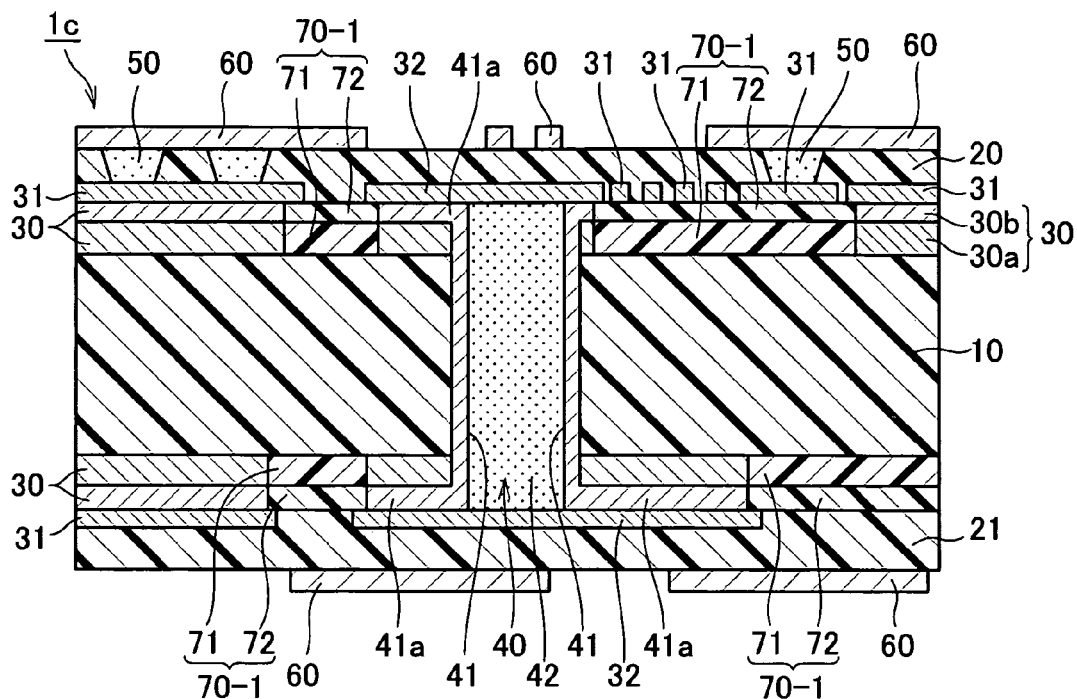
FIG. 10 is a view schematically showing a cross section of a printed wiring board according to a fifth embodiment of the present invention.

FIG. 10 is a view schematically showing a cross section of the printed wiring board 1c according to the fifth embodiment of the present invention.

The structure of the printed wiring board 1c according to the fifth embodiment has a resin film 70-1 having a different structure when compared with the resin film 70 in the printed wiring board 1 according to the first embodiment. Other components of the printed wiring board 1c according to the fifth embodiment are the same of those in the printed wiring board 1c according to the fifth embodiment. Accordingly, the following description will mainly explain the resin film 70-1 having a different structure.

As shown in FIG. 10, the resin film 70-1 is composed of a first resin layer 71 and a second resin layer 72 which are laminated or stacked in order on each of the surfaces of the wiring line formation layer 10. The first resin layer 71 and the second resin layer 72 have a different resin material. Because the first resin layer 71 and the second resin layer 72 in the resin film 70-1 have different characteristics, this structure of the resin film 70-1 allows for its function to change according to necessity.

For example, the first resin layer 71 is made of resin having a function to prevent voids from be generated therein and having a superior function to easy be embedded. On the other hand, the second resin layer 72 at the surface side of the resin film 70-1 has a superior function to be strongly bonded to the second inner layer wiring line 31.

It is possible to form the first resin layer 71 and the second resin layer 72 selected from one or more of epoxy resin, polyimide, phenol resin, BT (Bismaleimide Triazine) resin, PPE (Polyphenyleneether) resin, extended porous PPE, acrylic resin, etc.

In the structure of the printed wiring board 1c according to the fifth embodiment, the resin film 70-1 is composed of the first resin layer 71 and the second resin layer 72. It is possible to combine the structure of the fifth embodiment with the structure of each of the first to fourth embodiments. Still further, it is possible to roughly form the surface of the second resin layer 72 in order to increase the adhesion between the second resin layer 72 and the second inner layer wiring line 31.

Sixth Embodiment

A description will be given of the printed wiring board 1d and the method of producing the printed wiring board 1c according to the sixth embodiment of the present invention with reference to FIG. 11.

Figure 11:
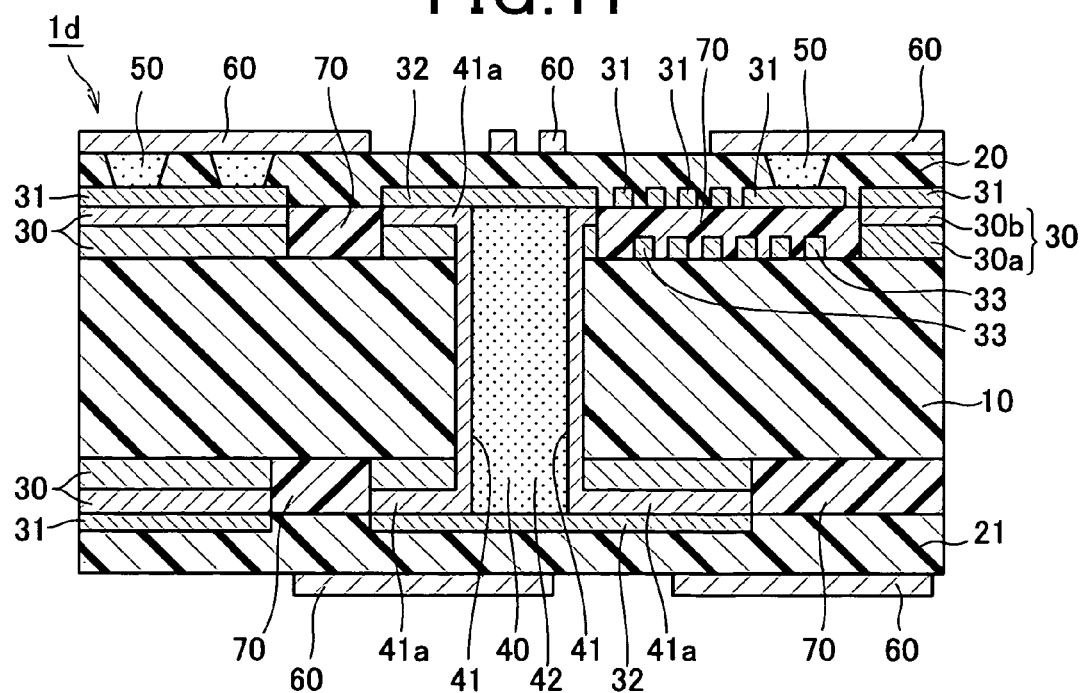
FIG. 11 is a view schematically showing a cross section of a printed wiring board according to a sixth embodiment of the present invention.

FIG. 11 is a view schematically showing a cross section of the printed wiring board 1d according to the sixth embodiment of the present invention.

The structure of the printed wiring board 1d according to the sixth embodiment further has a third inner layer wiring line 33 when compared with the structure of the printed wiring board 1 according to the first embodiment. Other components of the printed wiring board 1d according to the sixth embodiment are the same of those in the printed wiring board 1 according to the first embodiment. Accordingly, the following description will mainly explain the third inner layer wiring line 33.

As shown in FIG. 11, the third inner layer wiring line 33 is formed in the resin film 70 on one surface (front surface) of the wiring line formation layer 10. That is, the wiring line formation layer 10 is covered and sealed with the resin film 70.

The third inner layer wiring line 33 is formed by etching and patterning the copper foil 30a as the lower layer of the first inner layer wiring line 30. It is also possible to form the third inner layer wiring line 33 by various types of methods such as copper plating, copper foil etching, sputtering, evaporation, and inkjet method instead of the method of forming the copper foil.

According to the sixth embodiment, because the third inner layer wiring line 33 is formed in the inside of the resin film 70, it is possible to form the wiring lines with a high density. Still further, because the third inner layer wiring line 33 is only formed in the resin film 70, it is possible to combine the structure of the printed wiring board 1d with the structure of each of the printed wiring board according to the first to fifth embodiments.

Seventh Embodiment

A description will be given of the printed wiring board 1e and the method of producing the printed wiring board 1c according to the seventh embodiment of the present invention with reference to FIG. 12.

Figure 12:
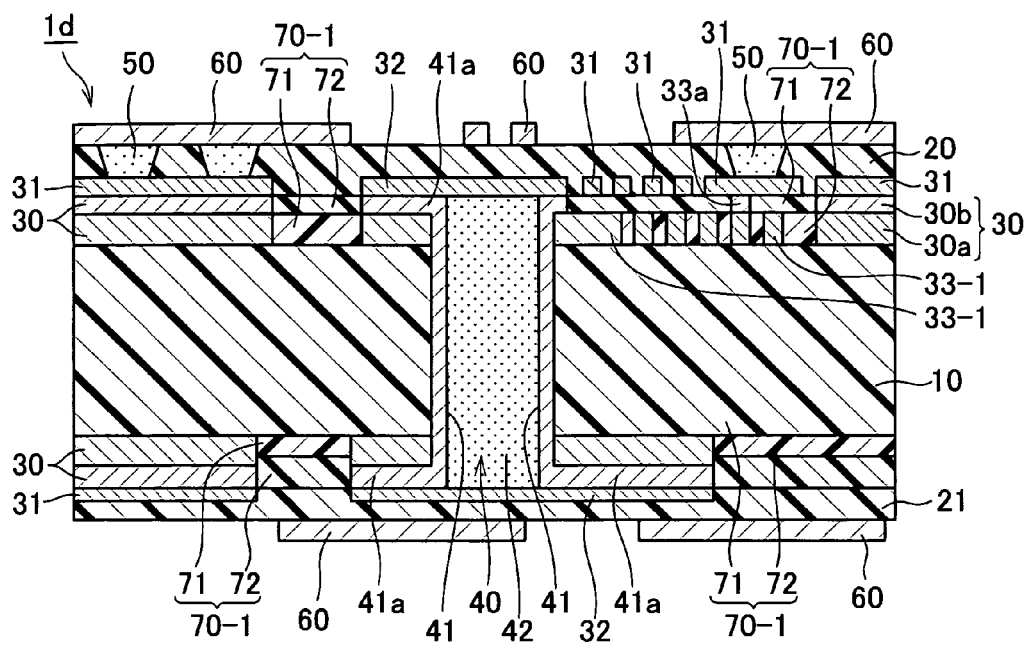
FIG. 12 is a view schematically showing a cross section of a printed wiring board according to a seventh embodiment of the present invention.

FIG. 12 is a view schematically showing a cross section of the printed wiring board 1e according to the seventh embodiment of the present invention.

The structure of the printed wiring board 1e according to the seventh embodiment further has a third inner layer wiring line 33-1 obtained by modifying the third inner layer wiring line 33 in the printed wiring board 1d according to the sixth embodiment. Other components of the printed wiring board 1e according to the seventh embodiment are the same of those in the printed wiring board 1c, 1d according to the fifth and sixth embodiments. Accordingly, the following description will mainly explain the third inner layer wiring line 33-1.

As shown in FIG. 12, in the structure of the printed wiring board 1e according to the seventh embodiment, a connection line 33a is formed in the inside of the resin film 70-1, with which the third inner layer wiring line 33-1 and the second inner layer wiring line 31 are electrically connected. This connection wiring line 33a is composed of a copper plated line.

The resin film in the printed wiring board 1e according to the seventh embodiment has the same structure of the resin film in the fifth embodiment. That is, the resin film 70-1 in the seventh embodiment is also composed of the first resin layer 71 and the second resin layer 72. It is possible to form the first resin layer 71 and the second resin layer 72 with the same resin material or different resin material. The third inner layer wiring line 33-1 substantially has the same thickness of the first resin layer 71 in the resin film 70-1. The connection wiring line 44a substantially has the same thickness of the second resin layer 72 in the resin film 70-1.

A description will now be given of the method of producing the printed wiring board 1e according to the seventh embodiment, in particular, to form the second inner layer wiring line 31, third inner layer wiring line 33-1, the connection wiring line 33a, and the resin film 70-1. The seventh embodiment uses the same method of the first and second embodiments.

First, the third inner layer wiring line 33-1 is formed on one surface (for example, front surface) of the wiring line formation layer 10 by etching a copper foil or a copper plated layer. The first resin layer 71 is formed between the third inner layer wiring line 33-1 on one surface of the wiring line formation layer 10 so that the third inner layer wiring line 33-1 and the first resin layer 71 have the same plane. It is possible to apply and then harden resin film, and further grind the hardened resin film for necessity.

Next, the connection wiring line 33 is formed on the surface of the third inner layer wiring line 33-1 by performing copper plating or etching. The second resin layer 72 is formed on the first resin layer 71 around the connection wiring line 33a. It is possible to form the second resin layer 72 by the same method of forming the first resin layer 71.

This makes the resin film 70-1 in which the second resin layer 72 is stacked on the first resin layer 71 to make a lamination, and further makes the lamination in which the resin film 70-1 has the same plane surface of the connection wiring line 33a.

The third inner layer wiring line 33-1 is formed on the surface of the resin film 70-1 so that the third inner layer wiring line 33-1 is electrically connected to the connection wiring line 33a. It is thereby completed to form the second inner layer wiring line 31, third inner layer wiring line 33-1, the connection wiring line 33a, and the resin film 70-1 in the printed wiring board 1e according to the seventh embodiment.

The seventh embodiment makes it possible to have a structure with a highly dense wiring structure in which the third inner layer wiring line 33-1 is electrically connected to the second inner layer wiring line 31 through the connection wiring line 33a in the resin film 70-1.

It is also possible to combine the structure of the resin film 70-1 composed of the first resin layer 71 and the second resin layer 72 with the structure of each of the embodiments previously described.

Figure 13:
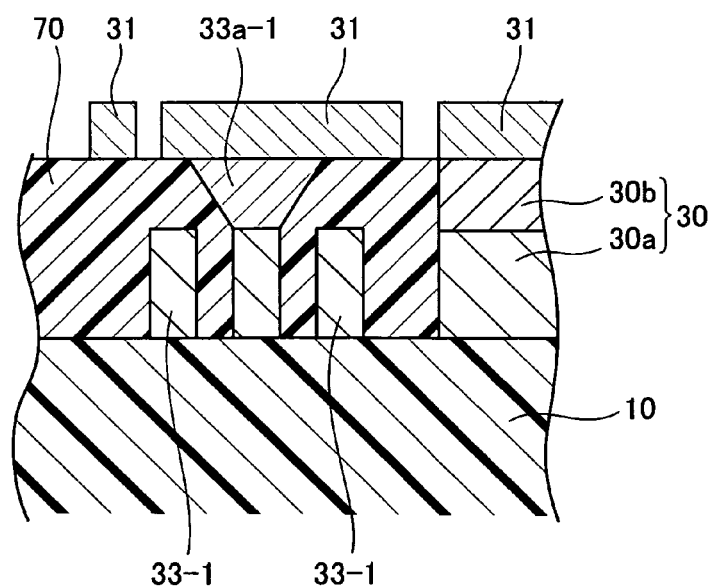
FIG. 13 is a view schematically showing a cross section of a part of the printed wiring board according to a modification of the seventh embodiment of the present invention.

FIG. 13 is a view schematically showing a cross section of a part of the printed wiring board according to a modification of the seventh embodiment of the present invention.

As shown in FIG. 13, the modification shown in FIG. 13 has the resin film 70 having a single layer, and a connection wiring line 33a-1 is formed in the resin film 70. The third inner layer wiring line 33-1 formed in the inside of the resin film 70 and the second inner layer wiring line 31 formed on the surface of the resin film 770 are electrically connected through the connection wiring line 33a-1.

In the seventh embodiment shown in FIG. 13, a cross sectional shape of the connection wiring line 33a-1 along the thickness direction of the resin film 70 is a trapezoid which is expanded from the side of the wiring line formation layer 10 to the surface of the resin film 70.

The method of producing the printed wiring board according to the seventh embodiment will now be briefly described.

First, the third inner layer wiring lines 33-1 are formed on one surface (as front surface) of the wiring line formation layer 10. The resin film 70 is formed on the third inner layer wiring lines 33-1 and also formed between the third inner layer wiring lines 33-1.

Holes are made in the parts corresponding to the connection wiring lines 33a-1 in the resin film 70 by using laser etching. The connection wiring lines 33a-1 are formed in the holes by performing copper plating or etching. The second inner layer wiring lines 31 are formed on the resin film 70 so that the second inner layer wiring lines 31 are electrically connected to the connection wiring lines 33a-1. This makes the printed wiring board having the structure shown in FIG. 13.

The seventh embodiment can produce the printed wiring board with high density. Further, because the resin film 70 has a single layer, it is possible to combine the structure of the printed wiring board according to the seventh embodiment with the structure of each of the embodiments previously described.

Eighth Embodiment

A description will be given of the printed wiring board if and the method of producing the printed wiring board if according to the eighth embodiment of the present invention with reference to FIG. 14.

Figure 14:
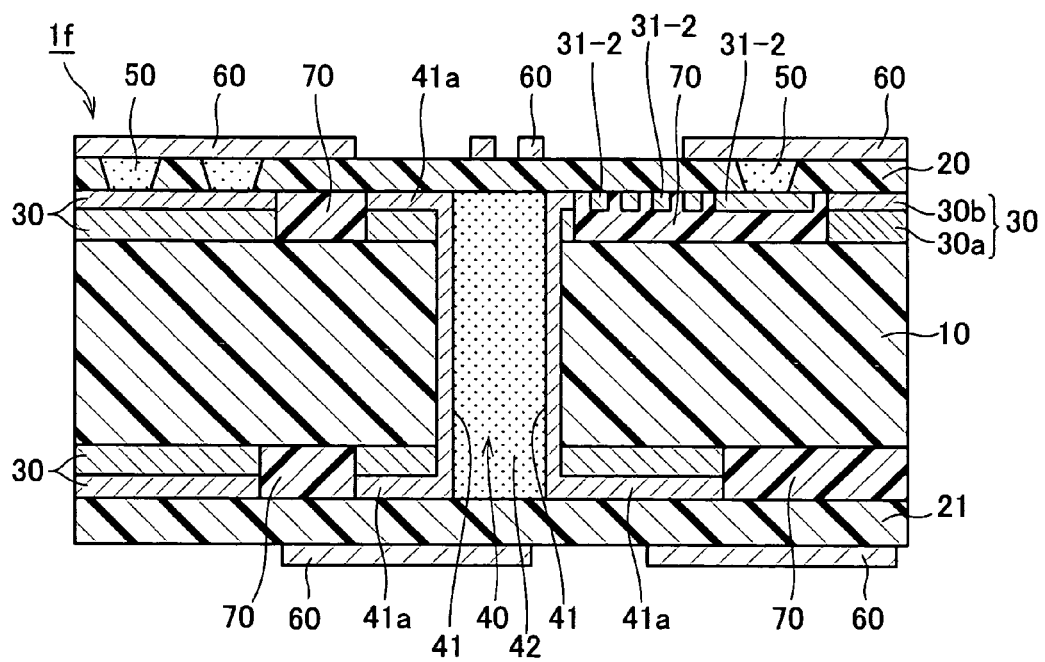
FIG. 14 is a view schematically showing a cross section of a printed wiring board according to an eighth embodiment of the present invention.

FIG. 14 is a view schematically showing a cross section of the printed wiring board if according to the eighth embodiment of the present invention.

The structure of the printed wiring board if according to the eighth embodiment has a second inner wiring line 31-2 having a modified structure of the second inner layer wiring line 31 formed on the resin film 70 in the printed wiring board 1 of the first embodiment.

Other components of the printed wiring board 1e according to the seventh embodiment are the same of those in the printed wiring board 1c, 1d according to the fifth and sixth embodiments. Accordingly, the following description will mainly explain the second inner wiring line 31-2.

In the structure of the printed wiring board 1f according to the eighth embodiment shown in FIG. 14, the second inner wiring line 31-2 is embedded in the resin film 70, and also exposed on the surface of the resin film 70 so that the second inner wiring line 31-2 and the resin film 70 have the same plane surface. That is, the surface of the second inner layer wiring line 31-2 and the surface of the resin film 70 have the same height measured from the surface of the wiring line formation layer 10.

After completion of forming the resin film 70, a groove is formed in the surface of the resin film 70 by using laser beam so that the groove can accommodate the second inner wiring line 31-2 therein. The second inner wiring line 31-2 is then formed in the groove by performing plating on the resin film 70 and the groove. After this, the surface of the second inner wiring line 31-2 is grinded until the surface of the resin film 70 is exposed.

In the structure of the printed wiring board 1f according to the eighth embodiment shown in FIG. 14, because the second inner wiring line 31-2 is exposed so that the resin film 70 and the second inner wiring line 31-2 have the same flat surface, it is possible to prevent the thickness of the printed wiring board 1f from increasing by the thickness of the second inner wiring line 31-2.

Ninth Embodiment

A description will be given of the printed wiring board 1g and the method of producing the printed wiring board 1g according to the ninth embodiment of the present invention with reference to FIG. 15.

Figure 15:
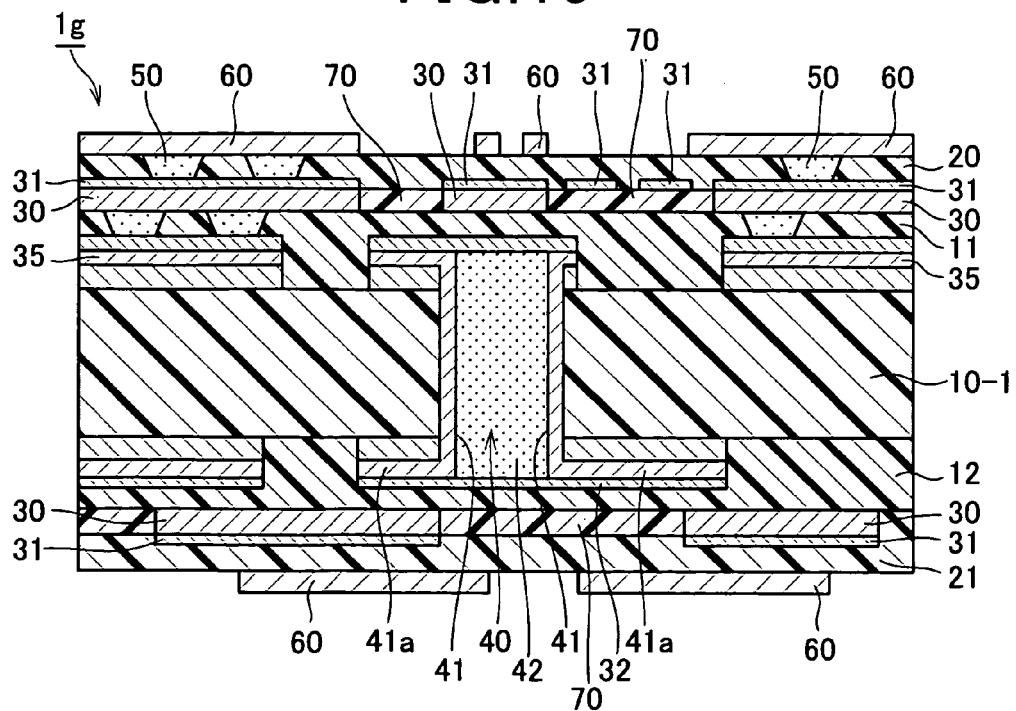
FIG. 15 is a view schematically showing a cross section of a printed wiring board according to a ninth embodiment of the present invention.

FIG. 15 is a view schematically showing a cross section of the printed wiring board 1g according to the ninth embodiment of the present invention.

The structure of the printed wiring board 1g according to the ninth embodiment has a wiring line formation layer 11. That is, the wiring line formation layer 11 is different from the wiring line formation layer 10 as the core layer in the printed wiring board 1 according to the first embodiment.

Other components of the printed wiring board 1g according to the ninth embodiment are the same of the components in the printed wiring boards according to the other embodiments. Accordingly, the following description will mainly explain the wiring line formation layer 11.

In the printed wiring board 1g according to the ninth embodiment shown in FIG. 15, a core layer 10-1 does not serve as the wiring line formation layer, and the insulation layer as the wiring line formation layer 11 is formed on one surface (upper surface side or front surface side of the core layer 10-1 shown in FIG. 15) of the core layer 10-1. That is, the insulation layer 11 serves as the wiring line formation layer. The description will use the wiring line formation layer 11 instead of the insulation layer.

By the way, an insulation layer 12 is formed on the other surface (bottom surface shown in FIG. 15) of the core layer 10-1. The through hole 40 formed in the core layer 10-1 and the wiring lines 35 formed on both surfaces of the core layer 10-1 are covered with the wiring line formation layer 11 and the insulation layer 12.

A first inner layer wiring line 30 having a first thickness (which is thicker than a second thickness of a second inner layer wiring line which will be explained later) is formed on the front surface (upper surface side or front surface side of the core layer 10-1 shown in FIG. 15) of the wiring line formation layer 11, and the resin film 70 is formed on the wiring line formation layer 11 other than the first inner layer wiring line 30. The resin film 70 and the first inner layer wiring line 30 have the same flat plane.

Further, the second inner layer wiring line 31 having the second thickness which is thinner than the first thickness of the first inner layer wiring line 30 is formed on the surface of the resin film 70.

Still further, the second inner layer wiring line 31 is formed on the first inner layer wiring line 30 on the wiring line formation layer 11.

The second inner layer wiring line 31 is not formed on the surface of the resin film 70 formed on parts of the surface (bottom surface side of the core layer 10-1 shown in FIG. 15) of the insulation layer 12 on the core layer 10-1. As shown in FIG. 15, the first inner layer wiring line 30, the resin film 70, and the second inner layer wiring line 31 on the first inner layer wiring line 30 are formed on the insulation layer 12.

Still further, in the wiring line formation layer 11, insulation layers 20 and 21 are formed so that the surfaces of the insulation layers 11 and 12, the wiring lines 30 and 31, and the resin film 70 are covered with these insulation layers 20 and 21.

The insulation layers 20 and 21, the via holes 50 formed in the insulation layers 20 and 21, and the surface layer wiring line 60 are the same of those in the printed wiring board according to each of the other embodiments.

The structure of the printed wiring board 1g makes it possible to form the first inner layer wiring line 30 and the second inner layer wiring line 31 having a different thickness by performing patterning process one time, and prevent the thickness of printed wiring board from increasing.

Tenth Embodiment

A description will be given of the printed wiring board 1h and the method of producing the printed wiring board 1h according to the tenth embodiment of the present invention with reference to FIG. 16.

Figure 16:
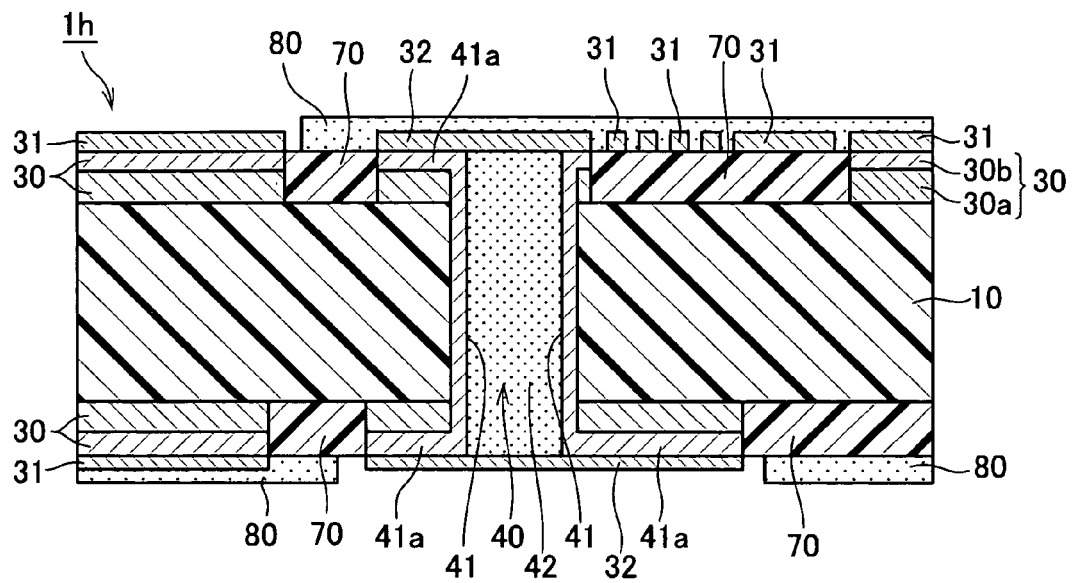
FIG. 16 is a view schematically showing a cross section of a printed wiring board according to a tenth embodiment of the present invention.

FIG. 16 is a view schematically showing a cross section of the printed wiring board 1h according to the tenth embodiment of the present invention.

The structure of the printed wiring board 1h according to the tenth embodiment has a single layer, not a lamination structure.

Other components of the printed wiring board 1h according to the tenth embodiment are the same of the components in the printed wiring boards according to the other embodiments.

As shown in FIG. 16, the first inner layer wiring line 30 and the resin film 70 are formed on the surface (front surface or upper surface) of the wiring line formation layer 10. The second wiring line 31 is formed on the first inner layer wiring line 30 and the resin film 70. The first inner layer wiring line 30 is thicker than the second wiring line 31. The through hole 40 and the covering wiring line 32 are formed in the wiring line formation layer 10, as well as the structure of the printed wiring board 1 according to the first embodiment, previously described.

In the structure of the printed wiring board 1h according to the tenth embodiment, one surface of the wiring line formation layer 10 forms the front surface of the printed wiring board 1h. Accordingly, the first inner layer wiring line 30, the wiring line 31, and the covering wiring line 32 are formed on the surface of the wiring line formation layer 10, not formed in the inside of the wiring line formation layer 10.

Still further, the second wiring line 31 is not formed on the resin film 70 on the other surface (bottom surface side in FIG. 16) of the wiring line formation layer 10.

As shown in FIG. 16, the first inner layer wiring line 30, the resin film 70, the second wiring line 31 formed on the first inner layer wiring line 30, and the covering wiring line 32 are formed on the other surface of the wiring line formation layer 10, as well as those on the front surface of the wiring line formation layer 10.

The first inner layer wiring line 30, the second wiring line 31, and the covering wiring line 32 formed on the front surface of the wiring line formation layer 10 are electrically connected to those lines 30, 31, 32 formed in the other surface of the wiring line formation layer 10 through the through hole 40. That is, the structure of the printed wiring board 1h according to the tenth embodiment is equivalent to the structure in which the insulation layers 20 and 21 and the via holes formed in these layers 20 and 21 and the surface layer wiring line 60 are eliminated from the structure of the printed wiring board 1 according to the first embodiment.

The structure of the printed wiring board 1h according to the tenth embodiment makes it possible to form the first inner layer wiring line 30 and the second wiring line 31 having a different thickness by performing patterning process one time, and to prevent the thickness of printed wiring board from increasing.

Still further, as shown in FIG. 16, a solder resist 80 is formed on the surface of the printed wiring board 1h so that the wiring lines 30, 31, and 32 are covered with the solder resist 80. The solder resist 80 prevent the wiring lines 30, 31, and 32 from being adhered with solder, and protect the wiring lines 30, 31, and 32 from damage. Because the surface of the resin film 70 and the surface of the wiring line 30 have the same flat surface, it is possible to uniformly form the solder resist 80 on the surface of the resin film 70 and the wiring line 30.

Eleventh Embodiment

A description will be given of the printed wiring board 1i and the method of producing the printed wiring board 1i according to the eleventh embodiment of the present invention with reference to FIG. 17.

Figure 17:
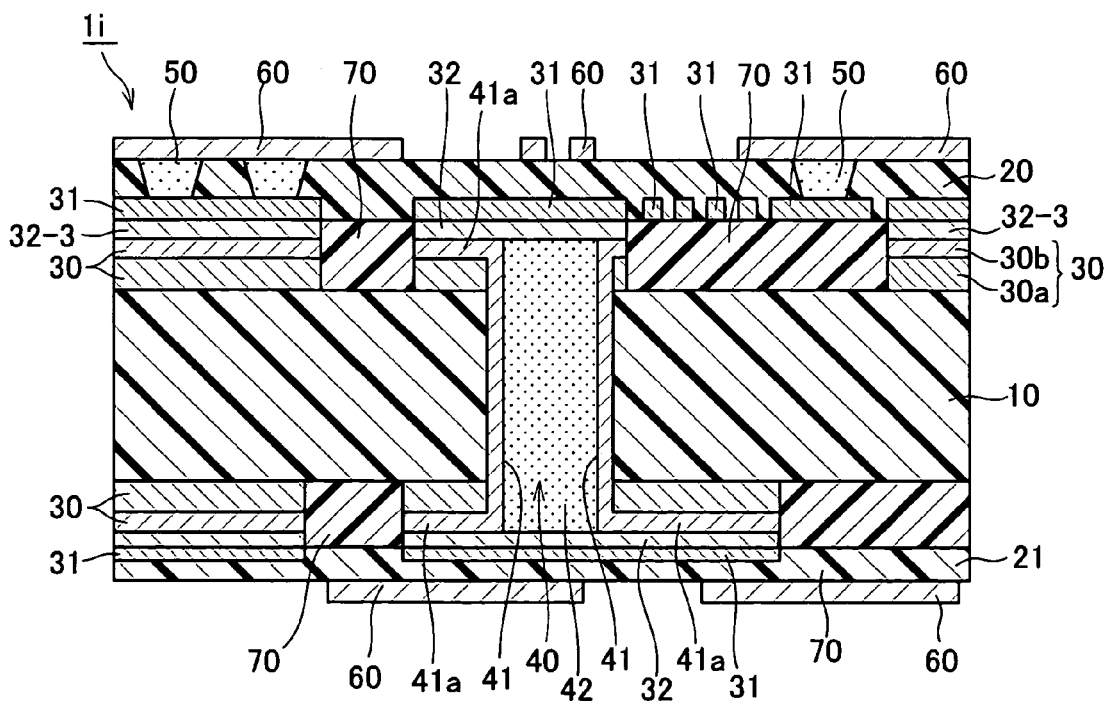
FIG. 17 is a view schematically showing a cross section of a printed wiring board according to an eleventh embodiment of the present invention.

FIG. 17 is a view schematically showing a cross section of the printed wiring board 1i according to the eleventh embodiment of the present invention.

The structure of the printed wiring board 1i according to the eleventh embodiment has the covering wiring line 32-1 formed on the through hole 40 and the second inner layer wiring line 31-3 which are made of same material and have the same thickness.

Other components of the printed wiring board 1i according to the eleventh embodiment are the same of the components in the printed wiring boards according to the other embodiments.

A description will now be given of the method of producing the printed wiring board 1i according to the eleventh embodiment, As well as the method according to the first and second embodiments shown in FIG. 1 to FIG. 5A-FIG. 5D, the first step to the fifth steps are performed in order. The first step forms the copper foil 30a as the first conductor on the wiring line formation layer 10. The second step then forms the hole 40a. The hole 40a becomes the through hole 40. The third step forms the copper plated layer 30b which serves as the second conductive layer. The fourth step forms the land part 41a of the through hole 40. The fifth step fills the hole 40a with the filler member 42.

Next, the covering wiring line 32 is formed on the land part 41a of the through hole 40 by patterning the copper film formed by plating or with copper foil. In the structure of the printed wiring board 1i shown in FIG. 17, the areas 32-3 made of the copper film is remained on the surface of the first inner layer wiring line 30 other than the covering wiring line 32 by patterning.

After this, as well as the method according to the first and second embodiments shown in FIG. 1 to FIG. 5A-FIG. 5D, the sixth step, the seventh step, and the eighth step are performed in order.

The sixth step forms the resin film 70 on the wiring line formation layer 10. The seventh step forms the copper plated layer 31a as the third conductive layer. The eighth step performs patterning of the copper plated layer 31a to form the second inner layer wiring line 31. The second inner layer wiring line 31 is exposed on the surface of the resin film 70 and the covering wiring line 32 by patterning performed in the eighth step.

After this, the insulation layers 20 and 21 are formed, and the via holes 50 and the surface layer wiring line 60 are formed. The method of producing the printed wiring board 1i according to the eleventh embodiment is thereby completed.

(Other Modifications)

It is also possible to have a structure in which the first inner layer wiring line 30, the first inner layer wiring line 30, and the covering wiring line 32 and the resin film 70 are formed only on one surface of the wiring line formation layer 10, not formed on the other surface thereof. This structure can also eliminate the through hole 40.

In the structure of each of the embodiments, the first inner layer wiring line is thicker in thickness than the second inner layer wiring line 31 by using the double structure with the first and second inner layer wiring lines. However, the concept of the present invention is not limited by this structure. It is also possible to use a single layer of the first inner layer wiring line and a single layer of the second inner layer wiring line. In this case, it is possible to adjust the thickness of the copper foil and the film formation condition in order to control the thickness of each of the first and second inner layer wiring lines. This control can be applied to the case having a multi-layer structure of the inner layer wiring lines.

In the embodiments previously above, the insulation layers 20 and 21 are formed on both the surfaces of the wiring line formation layer 10 as the core layer shown in FIG. 1. However, the concept of the present invention is not limited by this structure. For example, it is also possible to form a double layer or multi layers on each of the surfaces of the wiring line formation layer 10 as the core.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A printed wiring board comprising:
   a wiring line formation layer on which various types of wiring lines are formed;
   a first wiring line formed on a surface of the wiring line formation layer;
   a resin film formed on an area, other than the area in which the first wiring line is formed, on the surface of the wiring line formation layer so that the first wiring line and the resin film has the same plane surface; and
   a second wiring line formed on the surface of the resin film, where the second wiring line is thinner in thickness than the first wiring line.

2. The printed wiring board according to claim 1, wherein the wiring line formation layer has a through hole composed of:

a penetration hole formed in the wiring line formation layer along a direction in thickness of wiring line formation layer;

a conductive plated layer formed on an inner wall of the through hole; and a filler member with which the penetration hole is filled, a land part formed on the surface of the wiring line formation layer by extending the conductive plated layer from the through hole toward the area around the through hole on the first and second surface of the wiring line formation layer, where the area between the land part and the first wiring line is embedded with the resin film; and a covering wiring line with which the land part of the through hole is covered, where the covering wiring line and the second wiring line are made of the same material and have the same thickness.

3. The printed wiring board according to claim 2, wherein the covering wiring line has its shape selected from:

(a) the same shape of the land part observed from a direction which is perpendicular to the plane surface direction of the wiring line formation layer; and (b) a shape which is larger than a shape of the land part formed on the wiring line formation layer so that the covering wiring line expands from the outer periphery of the land part.

4. The printed wiring board according to claim 3, wherein the second wiring line is further formed on the surface of the first wiring line to assemble the first wiring line and the second wiring line together, the second wiring line formed on the first wiring line has its shape selected from:

(a) the same shape of the first wiring line observed from a direction which is perpendicular to the plane surface direction of the wiring line formation layer; and (b) a shape which is larger than a shape of the first wiring line formed on the wiring line formation layer so that the second wiring line expands from the outer periphery of the first wiring line.

5. The printed wiring board according to claim 2, wherein the covering wiring line has a shape which is smaller than the outer periphery of the land part observed from a direction which is perpendicularly to the plane surface direction of the wiring line formation layer.

6. The printed wiring board according to claim 5, wherein the second wiring line is further formed on the surface of the first wiring line to assemble the first wiring line and the second wiring line together, the second wiring line formed on the first wiring line has a shape which is smaller than the outer periphery of the first wiring line observed from a direction which is perpendicularly to the plane surface direction of the wiring line formation layer.

7. The printed wiring board according to claim 2, wherein the conductive layer and the filler member formed in the through hole are made of the same plated material.

8. The printed wiring board according to claim 2, wherein the resin film and the filler member formed in the through hole are made of the same resin.

9. The printed wiring board according to claim 1, further comprising an insulation layer with which the first wiring line, the second wiring line, and the covering wiring line are covered, and the insulation layer and the resin film are made of the same resin.

10. The printed wiring board according to claim 1, wherein the resin film is a rough surface, and the second wiring line is formed on the resin film having a rough surface.

11. The printed wiring board according to claim 1, wherein the resin film is composed of a first layer and a second layer which are stacked in order on the wiring line formation layer.

12. The printed wiring board according to claim 1, wherein the second wiring line is embedded in the resin film, and the surface of the second wiring line is exposed on the surface of the resin film so that the resin film and the second wiring line have the same plane surface.

13. The printed wiring board according to claim 1, wherein a limit of error in thickness of the resin film and the first wiring line is within 20% of the thickness of each of the resin film and the first wiring line.

14. The printed wiring board according to claim 1, wherein a limit of error in thickness of the resin film and the first wiring line is within 10% of the thickness of each of the resin film and the first wiring line.

15. A method of producing a printed wiring board in which a first wiring line is formed on a wiring line formation layer, a resin film is formed on an area other than the first wiring line on the wiring line formation layer, the resin film and the first wiring line have the same plane surface, a second wiring line is formed on the resin film, the second wiring line is thinner in thickness than the first wiring line, a through hole is formed by making a penetration hole in the wiring line formation layer in its thickness direction, and a conductive layer is formed on an inner wall surface of the penetration hole, and the penetration hole is filled with a filler member, and the conductive layer is formed expanded from the penetration hole and on the surface of the wiring line formation layer around the penetration hole, the resin film is formed between the land part and the first wiring line, a covering wiring line is formed on the wiring line formation layer, with which the through hole and the land part are covered, and the covering wiring line and the second wiring line are made of the same material and the same thickness, the method comprising steps of:

forming the first conductive layer on the surface of the wiring line formation layer;

forming the penetration hole in the wiring line formation layer and the first conductive layer in order to make the through hole;

forming the second conductive layer on the surface of the inner wall surface of the penetration hole and the surface of the first conductive layer by performing plating process, where the second conductive layer formed on the inner wall surface of the penetration hole becomes the conductive layer of the through hole;

patterning the first conductive layer and the second conductive layer on the surface of the wiring line formation layer in order to make the first wiring line and the land part of the through hole;

filling the inside of the penetration hole as the through hole having the conductive layer with filler member;

forming the resin film on the area between the land part and the first conductive layer on the surface of the wiring line formation layer so that the land part and the first conductive layer are embedded with the resin film, the resin film is formed on the area other than the first conductive layer, and the resin film and the first conductive layer have the same plane surface;

forming the third conductive layer on the surface of the resin film and the surface of the land part; and patterning the third conductive layer to form the second wiring line and the covering wiring line.

* * * * *